US009417465B2

(12) United States Patent
Hussein et al.

(10) Patent No.: US 9,417,465 B2
(45) Date of Patent: Aug. 16, 2016

(54) NANOPHONONIC METAMATERIALS

(71) Applicant: The Regents of the University of Colorado, a body corporate, Denver, CO (US)

(72) Inventors: Mahmoud I. Hussein, Superior, CO (US); Bruce L. Davis, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 54 days.

(21) Appl. No.: 14/247,228

(22) Filed: Apr. 7, 2014

(65) Prior Publication Data

US 2015/0015930 A1    Jan. 15, 2015

Related U.S. Application Data

(60) Provisional application No. 61/809,399, filed on Apr. 7, 2013.

(51) Int. Cl.
*H01L 23/34*  (2006.01)
*G02F 1/00*  (2006.01)
(Continued)

(52) U.S. Cl.
CPC ............... *G02F 1/009* (2013.01); *G02B 1/002* (2013.01); *G02F 1/0072* (2013.01); *G02F 1/015* (2013.01); *H03H 9/2405* (2013.01); *B82Y 20/00* (2013.01); *B82Y 30/00* (2013.01); *H03H 2009/155* (2013.01); *Y10S 977/833* (2013.01)

(58) Field of Classification Search
CPC ...... H01L 23/36; H01L 23/367; H01L 23/373

USPC ................................................ 257/706–720
See application file for complete search history.

(56) References Cited

U.S. PATENT DOCUMENTS 8,569,848 B2 * 10/2013 Chang et al. ............ F28F 13/06
257/414
2002/0172820 A1   11/2002 Majumdar et al.
(Continued)

OTHER PUBLICATIONS

International Preliminary Report on Patentability mailed Oct. 2, 2015 and International Search Report and Written Opinion mailed Oct. 28, 2014 in co-pending International Application No. PCT/US2014/033237 filed Apr. 7, 2014.

(Continued)

*Primary Examiner* — Cuong Q Nguyen
(74) *Attorney, Agent, or Firm* — Dinsmore & Shohl LLP

(57) ABSTRACT

Nanophononic metamaterials and methods for reducing thermal conductivity in at least partially crystalline base material are provided, such as for thermoelectric energy conversion. In one implementation, a method for reducing thermal conductivity through an at least partially crystalline base material is provided. In another implementation, a nanophononic metamaterial structure is provided. The nanophononic metamaterial structure in this implementation includes: an at least partially crystalline base material configured to allow a plurality of phonons to move to provide thermal conduction through the base material; and at least one nanoscale locally resonant oscillator coupled to the at least partially crystalline base material. The at least one nanoscale locally resonant oscillator is configured to generate at least one vibration mode to interact with the plurality of phonons moving within the base material and slowing group velocities of at least a portion of the interacting phonons and reduce thermal conductivity through the base material.

39 Claims, 15 Drawing Sheets

(51) Int. Cl.
  *H03H 9/24*   (2006.01)
  *G02B 1/00*   (2006.01)
  *G02F 1/015*   (2006.01)
  *B82Y 30/00*   (2011.01)
  *H03H 9/15*   (2006.01)
  *B82Y 20/00*   (2011.01)

(56) References Cited

U.S. PATENT DOCUMENTS

| | | |
|---|---|---|
| 2003/0049444 A1 | 3/2003 | Dai et al. |
| 2007/0230135 A1 | 10/2007 | Feger et al. |
| 2008/0173344 A1 | 7/2008 | Zhang et al. |
| 2009/0277609 A1 | 11/2009 | Chang et al. |
| 2010/0003516 A1 | 1/2010 | Majumdar et al. |
| 2010/0139289 A1 | 6/2010 | Barker et al. |
| 2010/0214034 A1 | 8/2010 | Peng et al. |
| 2012/0097204 A1 | 4/2012 | Yu et al. |

OTHER PUBLICATIONS

C. J. Vineis, A. Shakouri, A. Majumdar, and M. G. Kanatzidis, Adv. Mater. 22, 3970 (2010).
J. Tang, H.-T. Wang, D. H. Lee, M. Fardy, Z. Huo, T. P. Russell, and P. Yang, Nano Lett. 10, 4279 (2010).
J. K. Yu, S. Mitrovic, D. Tham, J. Varghese, and J. R. Heath, Nat. Nanotechnol. 5, 718 (2010).
B. L. Davis and M. I. Hussein, AIP Adv. 1, 041701 (2011).
J. B. Pendry, A. J. Holden, D. J. Robbins, and W. J. Stewart, IEEE Trans. Microwave Theory Tech. 47, 2075 (1999).
D. R. Smith, W. J. Padilla, D. C. Vier, S. C. Nemat-Nasser, and S. Schultz, Phys. Rev. Lett. 84, 4184 (2000).
Z. Y. Liu, X. X. Zhang, Y.W. Mao, Y. Y. Zhu, Z. Y. Yang, C. T. Chan, and P. Sheng, Science 289, 1734 (2000).

\* cited by examiner

2D NANOPHONONIC METAMATERIALS WITH 1D RESONATORS
2A: ORDERED RESONATORS, SINGLE-SIDED
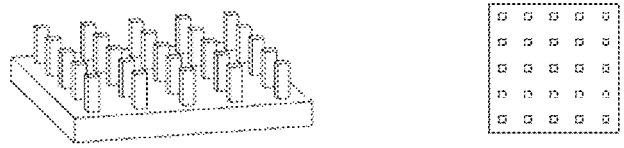
2B: ORDERED RESONATORS, DOUBLE-SIDED
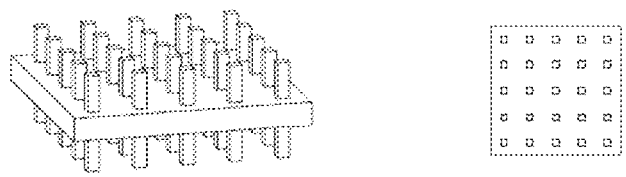
2C: ORDERED RESONATORS, EMPTY SPACE BETWEEN GROUPS OF RESONATORS
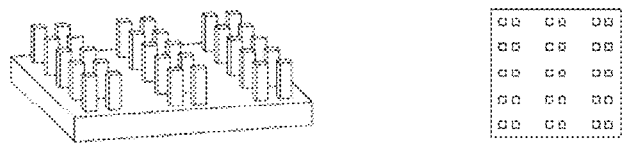
2D: ORDERED RESONATORS, MULTIPLE RESONATORS OF DIFFERENT HEIGHTS PER UNIT CELL
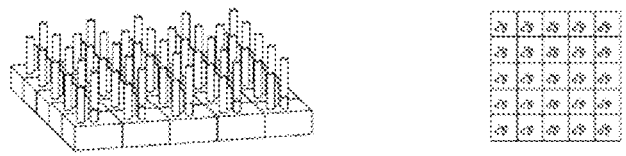
2E: ORDERED RESONATORS, MULTIPLE RESONATORS OF DIFFERENT THICKNESSES PER UNIT CELL
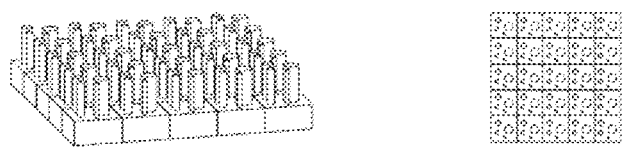
FIG. 2

2D NANOPHONONIC METAMATERIALS WITH 1D RESONATORS
(CONTINUED)

A: RESONATORS ORDERED IN POSITION AND HEIGHT, RANDOM IN THICKNESS

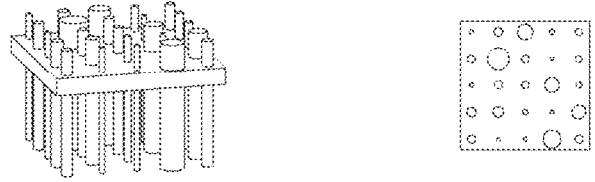

B: RESONATORS ORDERED IN POSITION AND THICKNESS, RANDOM IN HEIGHT

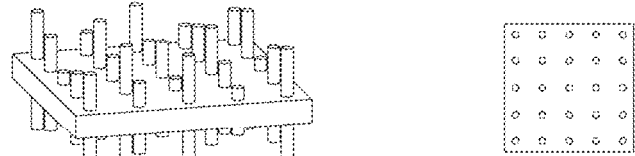

C: RESONATORS RANDOM IN POSITION AND HEIGHT, ORDERED IN THICKNESS

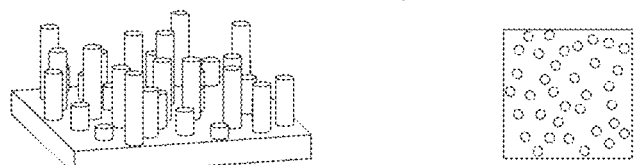

D: RESONATORS RANDOM IN POSITION AND THICKNESS, ORDERED IN HEIGHT

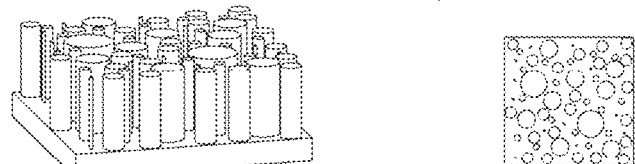

E: RESONATORS RANDOM IN POSITION, HEIGHT AND IN THICKNESS

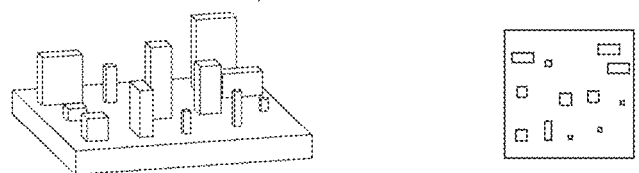

F: STACKED 2D NANOPHONONIC METAMATERIAL (E.G., STACKED THIN-FILMS WITH COLUMNS IN BETWEEEN)

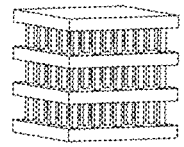

FIG. 9

2D NANOPHONONIC METAMATERIALS WITH EMBEDDED RESONATORS
A: INTERNAL LOCALIZED RESONATOR
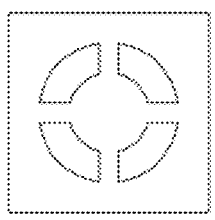
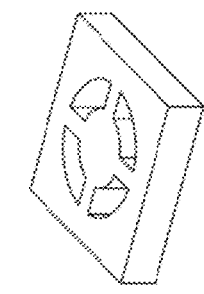
B: RESONATOR CONSISTING OF AN INCLUSION MADE OUT OF A MATERIAL SIGNIFICANTLY MORE COMPLIANT THAN THE BASE MATERIAL
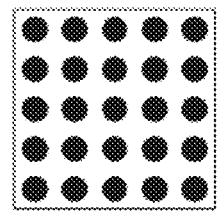
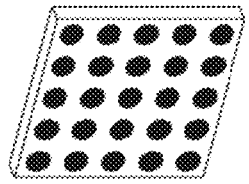
FIG. 10

2D NANOPHONONIC METAMATERIALS WITH 2D RESONATORS
A: ORDERED, WALL-LIKE RESONATORS ALIGNED ALONG A SINGLE DIRECTION
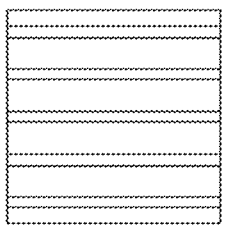
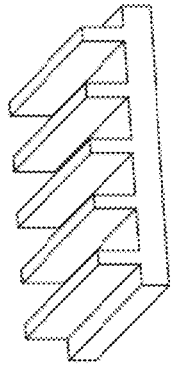
B: ORDERED, WALL-LIKE RESONATORS ALIGNED ALONG MULTIPLE DIRECTIONS
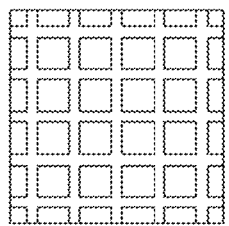
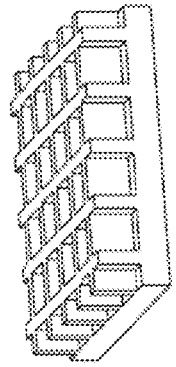
FIG. 11

1D NANOPHONONIC METAMATERIALS WITH 1D RESONATORS
A: ORDERED, UNIFORM HEIGHT OF PILLARS IN THE UNIT CELL
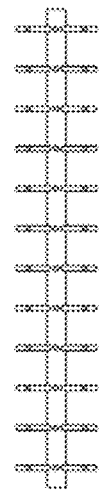
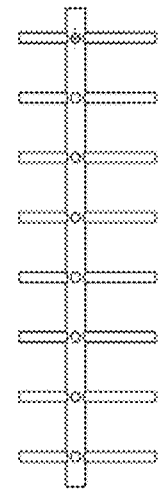
B: ORDERED, MULTIPLE HEIGHTS OF PILLARS IN THE UNIT CELL
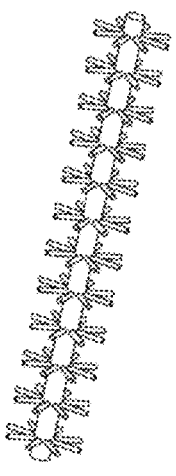
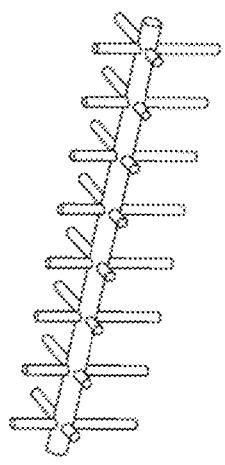
FIG. 12

1D NANOPHONONIC METAMATERIALS WITH 2D RESONATORS
A: ORDERED, DISK-LIKE RESONATORS WITH UNIFORM RADIUS
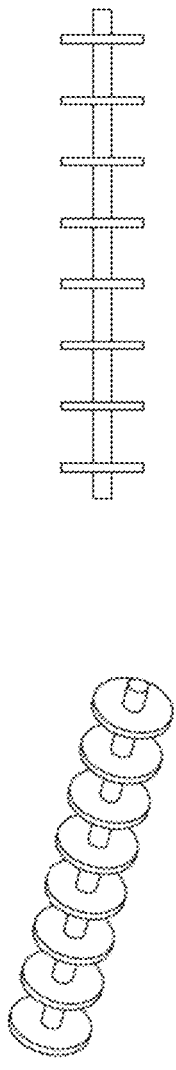
B: ORDERED, DISK-LIKE RESONATORS WITH MULTIPLE RADII IN THE UNIT CELL
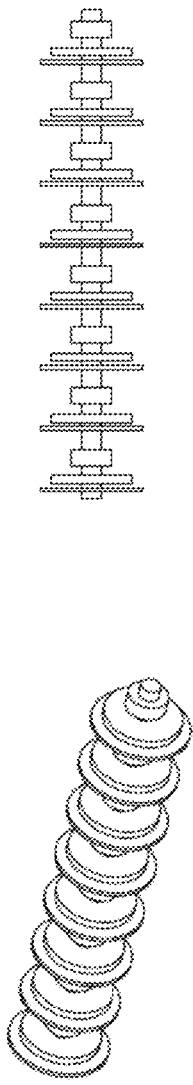
FIG. 13

3D NANOPHONONIC METAMATERIALS WITH EMBEDDED RESONATOR
A: INTERNAL LOCALIZED RESONATOR
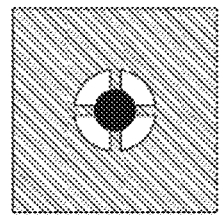
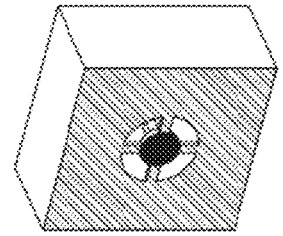
B: RESONATOR CONSISTING OF AN INCLUSION MADE OUT OF A MATERIAL SIGNIFICANTLY MORE COMPLIANT THAN THE BASE MATERIAL.
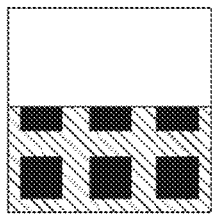
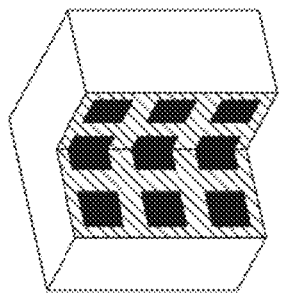
FIG. 14

NANOPHONONIC METAMATERIALS

CROSS-REFERENCE TO RELATED APPLICATIONS

This application claims the benefit of U.S. provisional application No. 61/809,399, filed 7 Apr. 2013 and entitled "Lattice Dynamics and Thermal Transport Properties of Nanophononic Materials, which is hereby incorporated by reference as though fully set forth herein.

STATEMENT REGARDING FEDERALLY SPONSORED RESEARCH OR DEVELOPMENT

This invention was made with government support under grant number CMMI0927322 awarded by the National Science Foundation. The government has certain rights in the invention.

BACKGROUND a. Field

The instant invention relates to reducing group velocities of phonons traveling within an at least partially crystalline base material. One purpose for group velocity reductions is to reduce thermal conductivity; another is to improve the thermoelectric energy conversion figure of merit. In particular implementations, the instant invention relates to reducing group velocities of phonons traveling within an at least partially crystalline base material by interacting one or more vibration modes generated by at least one locally resonant oscillator with one or more of the phonons.

b. Background

The thermoelectric effect refers to the ability to generate an electric current from a temperature difference between one side of a material and another. Conversely, applying an electric voltage to a thermoelectric material can cause one side of the material to heat while the other side stays cool, or, alternatively, one side to cool down while the other stays hot. Devices that incorporate thermoelectric materials have been used in both ways: to create electricity from a heat source or to provide cooling or heating by consuming electricity. To date, thermoelectric devices have been limited to niche or small-scale applications, such as providing power for the Mars Curiosity Rover or the cooling of precision instruments.

The widespread use of thermoelectric materials has been hindered by the problem that materials that are good electrical conductors also tend to be good conductors of heat. This means that at the same time a temperature difference creates an electric potential, the temperature difference itself begins to dissipate, thus weakening the current it created. Materials that have both high electrical conductivity, $\sigma$, and high thermal conductivity, $\kappa$, behave poorly in converting a temperature difference to an electric potential. In order for a material to perform well as a thermoelectric material, it should possess a high value of the figure of merit, $ZT=(S^2\sigma/\kappa)T$, where S is the Seebeck coefficient, and T is the temperature.

In the past, scientists have tackled this problem by searching for materials with intrinsic properties that allow the conduction of electricity to take place more easily than the conduction of heat. More recently, nanotechnology has been utilized by material scientists to engineer nanostructured materials that would exhibit the properties desired. The utilization of nanostructuring for control of heat transport has been a rapidly growing area of research. Researchers have tried various schemes to reduce heat transport in thermoelectric materials, such as introducing holes, inclusions, interfaces and/or grains of other materials into a thermoelectric material in order to scatter the phonons (carriers of heat), but these tend to reduce the transport of electric current as well (because they scatter the electrons), which negated the improvement.

The manipulation of elastic waves in a macroscale periodic medium (i.e., with unit-cell size in the order of hundreds of micrometers or higher) can be realized primarily in two distinct ways: (i) the utilization of Bragg-scattering phononic crystals and (ii) the introduction of local resonance. The latter renders the medium a "metamaterial," The concept of a phononic crystal involves a material with an artificial periodic internal structure for which the lattice spacing has a length scale on the order of the propagating waves. In such a configuration, wave interferences occur across the unit cell providing a unique frequency band structure with the possibility of band gaps. The concept of a metamaterial, on the other hand, generally involves the inclusion of local resonators (i.e., mechanical oscillators) which enable unique subwavelength properties to emerge. While periodicity is advantageous in some implementations, it is not necessary in a metamaterial. At a macroscale (where the focus is on acoustics or mechanical vibrations), periodic locally resonant metamaterials have been considered in various forms, such as by having heavy inclusions coated with a compliant material (e.g., rubber-coated lead spheres) and hosted in a relatively lighter and less stiff matrix (e.g., epoxy) Z. Y. Liu, X. X. Zhang, Y. W. Mao, Y. Y. Zhu, Z. Y. Yang, C. T. Chan, and P. Sheng, *Science* 289, 1734 (2000), or by the presence of pillars on a plate Y. Pennec, B. Djafari-Rouhani, H. Larabi, J. O. Vasseur, and A. C. Hladky-Hennion, *Phys. Rev. B* 78, 104105 (2008); T. T. Wu, Z. G. Huang, T. C. Tsai, and T. C. Wu, *Appl. Phys. Lett.* 93, 111902 (2008).

In recent years, the concept of a phononic crystal has been applied to the problem of nanoscale phonon (thermal) transport. In this context, the periodic material can be realized in a variety of ways such as by the layering of multiple constituents, also known as a layered superlattice M. N. Luckyanova, J. Garg, K. Esfarjani, A. Jandl, M. T. Bulsara, A. J. Schmidt, A, J. Minnich, S. Chen, M. S. Dresselhaus, Z, F. Ren, E. A. Fitzgerald, and G. Chen, *Science* 338, 936 (2012), or the introduction of inclusions and/or holes, as in a nanophononic crystal (NPC) J. Tang, H.-T. Wang, D. H. Lee, M. Fardy, Z. Huo, T, P. Russell, and P. Yang, *Nano Lett.* 10, 4279 (2010); J. K. Yu, S, Mitrovic, D. Tham, J, Varghese, and J. R. Heath, *Nat. Nanotechnol.* 5, 71.8 (2010). To date, the notion of a locally resonant phononic (or elastic or acoustic) metamaterial has been limited to microscale problems where the interest and applicability is in mechanical vibrations or acoustics opposed to thermal transport and heat transfer).

BRIEF SUMMARY

Manipulation of heat carrying phonons, or elastic waves that propagate and scatter at the nanoscale, can yield beneficial thermal properties. One application relates to thermoelectric materials, or the concept of converting energy in the form of heat into electricity and vice versa. As used herein, the term nanoscale refers to a scale on the order of 1 nm to hundreds of nanometers, but less than one micrometer.

In one implementation, nanostructures are provided that reduce the thermal conductivity k without a significant negative impact to the electrical conductivity as well as the power factor $S^2\sigma$ (where S is the Seebeck coefficient and $\sigma$ is the electrical conductivity) of a thermoelectric material and provides the ability to achieve high values of the thermoelectric energy conversion ZT figure of merit.

In one implementation, the nanophononic metamaterial with at least one locally resonant oscillator comprises at least one nanoscale pillar extending from a surface of the at least partially crystalline base material. The extension of the one or more pillars from the base material improves the thermoelectric energy conversion figure of merit, ZT, by freeing the at least partially crystalline base material from local resonators (or at least added local resonators) acting as internal scatterers that hinder the motion of electrons and cause a reduction in electrical conductivity of the base material.

In one implementation, for example, a method for reducing thermal conductivity through an at least partially crystalline base material is provided. In this implementation, the method comprises: generating a plurality of local vibration modes within the at least partially crystalline base material by the oscillation of at least one nanoscale locally resonant oscillator coupled to the base material; and interacting at least one of the local vibration modes created by the at least one nanoscale locally resonant oscillator with a plurality of phonons moving within the base material slowing group velocities of at least a portion of the interacting phonons.

In another implementation, a nanophononic metamaterial structure is provided. The nanophononic metamaterial structure in this implementation includes: an at least partially crystalline base material configured to allow a plurality of phonons to move to provide thermal conduction through the base material; and at least one nanoscale locally resonant oscillator coupled to the at least partially crystalline base material. The at least one nanoscale locally resonant oscillator is configured to generate at least one vibration mode to interact with the plurality of phonons moving within the base material and slowing group velocities of at least a portion of the interacting phonons and reduce thermal conductivity through the base material The foregoing and other aspects, features, details, utilities, and advantages of the present invention will be apparent from reading the following description and claims, and from reviewing the accompanying drawings.

BRIEF DESCRIPTION OF THE DRAWINGS

FIG. 2 depicts a variety of example configurations of 2D nanophononic metamaterials with 1D locally resonant oscillators extending from a base material.

FIG. 9 depicts an additional variety of example configurations of 2D nanophononic metamaterials with 1D locally resonant oscillators extending from a base material.

FIG. 10 depicts a variety of example configurations of 2D nanophononic metamaterials with embedded resonant oscillators.

FIG. 11 depicts a variety of example configurations of 2D nanophononic metamaterials with 2D locally resonant oscillators extending from a base material.

FIG. 12 depicts a variety of example configurations of 1D nanophononic metamaterials with 1D locally resonant oscillators extending from a base material.

FIG. 13 depicts a variety of example configurations of 1D nanophononic metamaterials with 2D locally resonant oscillators extending from a base material.

FIG. 14 depicts a variety of example configurations of 3D nanophononic metamaterials with embedded resonant oscillators.

DETAILED DESCRIPTION

Figure 1:
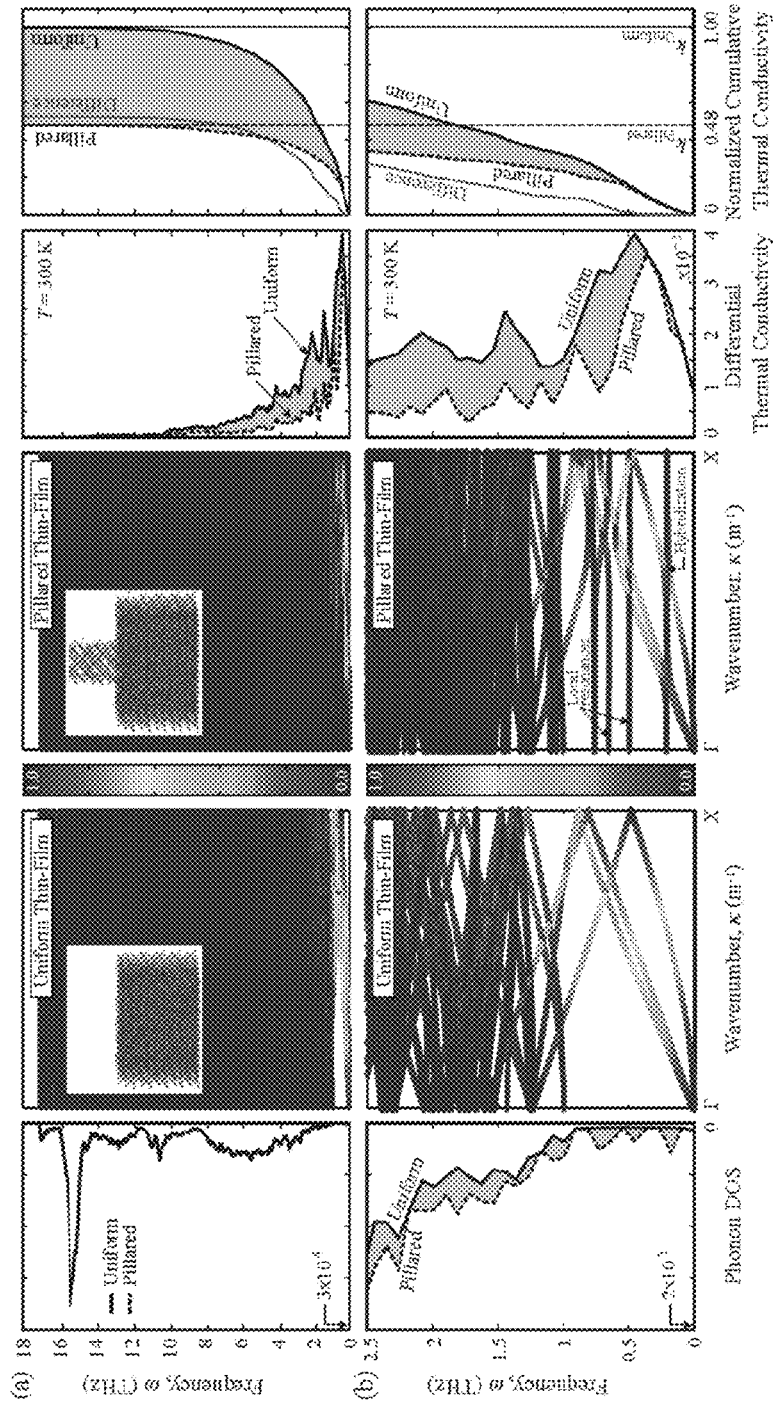
FIG. 1 shows a comparison of the phonon dispersion and thermal conductivity of a pillared silicon thin film with a corresponding uniform thin film. The dispersion curves are colored to represent the modal contribution to the cumulative thermal conductivity, normalized with respect to the highest modal contribution in either configuration. The full spectrum is shown in (a) and the $0 \leq \omega \leq 2.5$ THz portion is shown in (b). Phonon DOS and the thermal conductivity, in both differential and cumulative forms, are also shown. The gray regions represent the difference in quantity of interest between the two configurations. The introduction of the pillar in the unit cell causes striking changes to all these quantities.

A phononic metamaterial at the nanoscale, also described as a nanophononic metamaterial (NPM) herein, is provided. In some implementations, a NPM can be used to significantly reduce thermal conductivity in a nanostructured semiconducting material and, in other implementations, do so without affecting (or at least without significantly affecting) other important factors for thermoelectric energy conversion, such as the electrical conductivity.

Heat flow is carried by atomic waves (phonons) with a wide range of frequencies. An NPM contains miniature oscillators/resonators (these two terms are used interchangeably herein) that exchange energy with phonons and alter their propagation characteristics. When the frequency of a passing phonon matches a mode of an oscillator of an NPM, a coupling/hybridization/interaction occurs between a vibration mode of the oscillator and the phonon. This leads to a reduction in the group velocity of the interacting phonon, which, in turn, causes a reduction in the amount of heat carried by the phonon. Looking at this phenomenon more broadly, the local resonances of the oscillators couple/hybridize/interact with the underlying lattice dispersion of a crystalline (or partially crystalline) material to which the oscillators/resonators are incorporated. As a result, a reduction occurs in the group velocities for the phonon wave propagation (Bloch) modes at and near the coupling/hybridization/interaction as indicated in a frequency versus wave vector diagram. Where the local resonances are numerous and span the entire spectrum, the couplings will be numerous and will span the entire spectrum (e.g., up to THz). This leads to a significant reduction in the overall thermal conductivity of a material. Thus, introduction of local resonators (specifically ones that exhibit numerous and spread out modes with the lowest mode corresponding to a frequency as low as possible) can reduce the thermal conductivity of the base material significantly. This concept is demonstrated in FIG. 1 for a particular implementation that is described below.

The idea is a structural concept that is in principle independent of the base material used. As such, the proposed concept may be implemented using a wide range of materials (e.g., a semiconducting material). The concept may be even applied using a nanocomposite or a conventional thermoelectric material that performs well (for thermoelectric energy conversion) in its raw chemical form or that has already been nano structured in a different way to improve its performance. The better the thermoelectric performance of the base material in its raw form, the better the final thermoelectric performance upon the introduction of the local oscillators/resonators. In one particular implementation, a base material of single crystal silicon may be selected due to its low cost, abundance, advanced state-of-the art in analysis and fabrication, excellent industrial infrastructure already available, high resistance to high temperature and for being non-toxic. Although particular examples described herein may include a particular base material, these are merely examples and many other types of materials may also be used.

The idea is inherently robust, i.e., performance is resistant (insensitive) to variations in the geometry of all features pertaining to the main body of the material and the local oscillators or resonators (the terms oscillator and resonator are used interchangeably herein). This attribute implies, for example, resistance to surface roughness which provides practical benefits since, at least currently, low-cost nanofabrication of very smooth nanostructures continue to be a technological challenge.

Unlike other group velocity reduction strategies that use nanostructuring (such as the introduction of periodic inclusions or holes) and that depend on manipulating the travelling wave dispersion of the main body, e.g., by Bragg scattering (which are very sensitive to surface roughness), the local resonances associated with the local oscillators/resonators are standing waves (localized vibrations). One advantage is that the effects of these standing waves on reducing the thermal conductivity are practically not negatively influenced by the surface roughness. The roughness will only cause small shifts (up or down) in the frequency values of the local resonances, and, as such, the overall effect of the roughness on reducing the thermal conductivity by the hybridization mechanism is low. Furthermore, should the local oscillators/resonators be incorporated in a periodic fashion, where Bragg scattering may take place or partially take place and causes at least some reduction in the group velocities, the group velocity reduction due to the local oscillators/resonators will be additive (i.e., over and beyond what is achieved by Bragg scattering and other means such as reduced dimensionality of the base material structure).

In one implementation, for example, the material comprises an approximately two-dimensional thin-film base material including an array of oscillators configured to provide local resonance. An array of pillars, for example, may extend from one or both free surfaces of the thin-film material (see, for example, FIGS. 2A and 2B). This type of implementation is referred to as a "pillared thin-film implementation." As used herein, the term "pillar" refers to an upstanding and/or downstanding member or part that extends from a surface of a base material, such as a protrusion, extrusion, extension or the like. A pillar, for example, may comprise any number of shapes, forms, heights, distribution, location, orientation, material composition or the like. Further, a pillar may be integrally formed of the same material as a base material, may be joined or otherwise attached (directly or indirectly) to the base material, may include the same or different material as the base material. A pillar, in some implementations, may comprise a nanoscale pillar.

Further, the terms one-dimensional (1D), two-dimensional (2D) and three-dimensional (3D) are used herein to describe both the characteristics of various base material configurations as well as the shape, size, orientation, material composition and/or location/distribution of local oscillators/resonators. A nanoscale base material, for example, may be described as a one-dimensional (1D) base material in the shape of a wire or rod or column that extends, with the exception of other nanoscale dimensions, in a generally single dimension. Similarly, a nanoscale base material, such as a nanomaterial thin-film/membrane/sheet or plate-shaped base material may be described as a two-dimensional (2D) structure, with the exception of other nanoscale dimensions, that extends in two dimensions. Also, a different base material, such as a bulk material, may be described as a three-dimensional (3D) base material. Similarly, local oscillators/resonators, such as pillars shown in FIG. 3 may also be described with respect to one, two or three dimensional structures as described below with reference to those figures.

A two-dimensional (2D) nanomaterial configuration may be described as a thin film with a thickness roughly less than 500 nm. One advantage of using this configuration for a base material structure (i.e., a base material structural configuration to which the oscillators/resonators are applied to) is that the thermal conductivity gets reduced by a factor of three or more compared to a bulk state of the same material. This reduction in the thermal conductivity is due to (1) a reduction in group velocities due to the thin film structure (this effect weakens with rough surfaces) and (2) due to diffusive scattering of the phonons at the surfaces (this effects strengthens with rough surfaces). Either way, the overall reduction in the thermal conductivity is advantageous for the thermoelectric energy conversion.

Realization of local oscillators/resonators in the form of pillars in this particular implementation, for example, where the pillars extend perpendicularly (or generally perpendicularly), or following a non-perpendicular orientation, from one or both free surfaces, provide an advantage in that the main body of the thin film remains unaltered (this is in contrast to other nanostructuring strategies that involve altering the main body of the thin film by introducing holes or particles or interfaces or grains within this body), thus reducing the likelihood (or intensity) of undesirably scattering the electrons as well. Reducing the thermal conductivity without reducing the electrical conductivity (as well as the Seebeck coefficient) is very desirable for achieving a high thermoelectric energy conversion figure or merit.

In one implementation, local oscillators/resonators in the form of pillars are positioned periodically along one or both free surfaces of a thin-film base material. While the pillars in principle need not be arranged periodically for the hybridization effect to take root (the relaxation of the periodicity requirement is an advantage from the point of view of design/fabrication flexibility and insensitivity to geometric variations), the periodic positioning of the pillars in this particular implementation (1) provides an efficient way to compactly arrange the pillars, (2) allows for a systematic way to theoretically analyze, assess and design the nanostructured nanophononic metamaterial, and (3) the periodicity provides an additional mechanism for reduction of group velocities, namely, by Bragg scattering (like free surfaces, this effect weakens with rough surfaces) and thus reducing the thermal conductivity.

In the various implementations, a size scale of a unit cell (or a representative volume element if the configuration is not periodic) of a nanophononic metamaterial (e.g., the thin-film thickness and lattice spacing between pillars in the pillared thin-film case) is selected to be on the order of 10 to 500 nm (or moderately lower or higher than that range). If significantly higher, the unit cell (or representative volume element) would be too large compared to the mean free path of the phonons leading to a deterioration of the coupling/hybridization/interaction effect between the local resonances and the base material phonons/dispersion and thus a loss of the favorable effects that are brought about by the presence of the resonating pillars (or other type of oscillators/resonators); and, in some implementations, if the unit cell (or representative volume element) is too large compared to the mean free path the benefit effects that come about from its periodic arrangement (i.e., Bragg scattering) is also lost. If the characteristic length scale of the unit cell (or representative volume element) is smaller, then the number of atoms in the pillars (or other type of oscillators/resonators) will be lower and thus the number of local resonances will be lower which would lead to a lower thermal conductivity reduction effect, although this may still be acceptable in some instances/applications.

Figure 4:
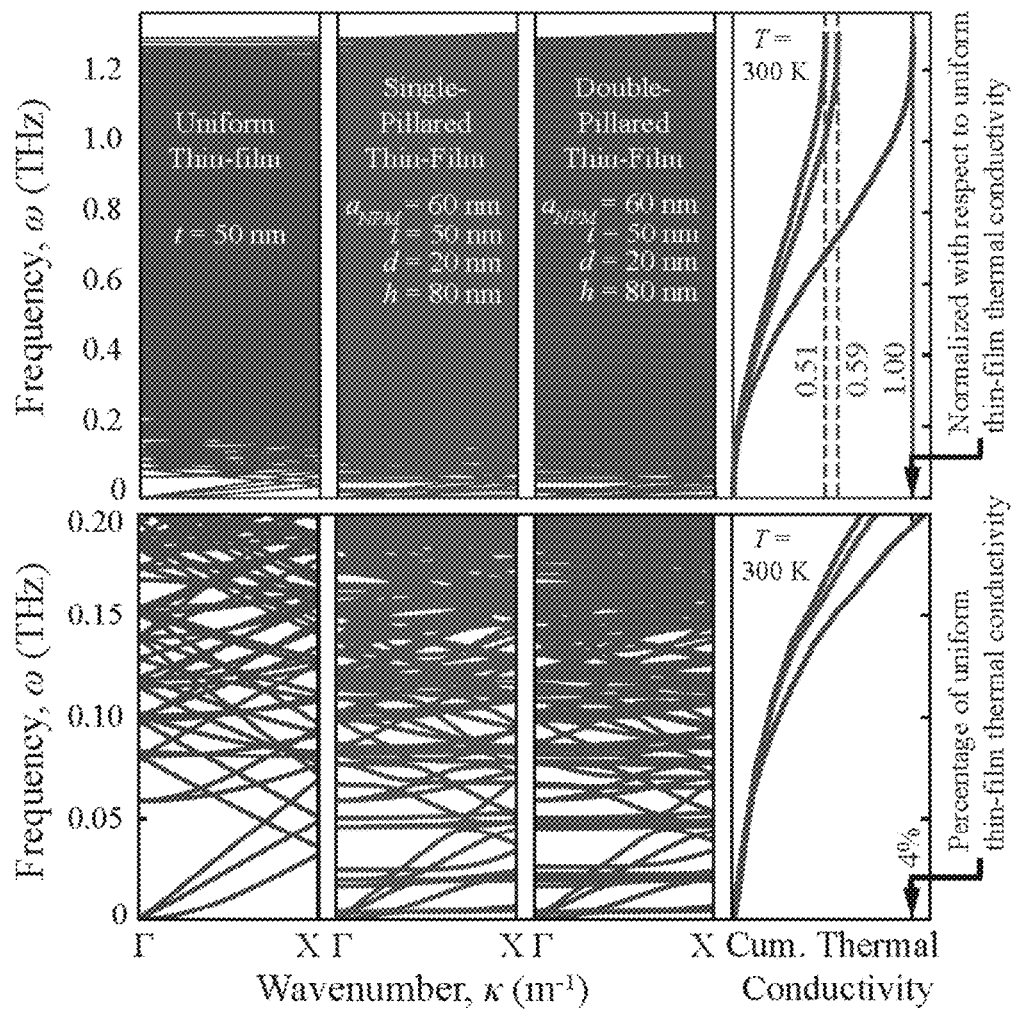
FIG. 4 shows a full dispersion comparison of a uniform t=50-nm thin film (left), with an 80-nm single pillar (center), and an 80-nm double pillar (right). A focus on the first few dispersion branches is also shown, as well as the cumulative thermal conductivity as a function of frequency.

In the pillared thin-film implementation, the thickness of the thin film, the lattice spacing and the height of the pillars, all relative to each other, can be selected such the largest number of pillars can be used per unit area (to increase the extend of the thermal conductivity reduction) but without the coupling between the pillars becoming excessive, which can lead to the extent of the thermal conductivity reduction being weakened (this may occur when the coupling between the pillars exceeds a certain level). In one implementation, for example, relative dimensions are provided as discussed below and shown in FIG. 4. However, upon optimization studies, other sets of relative dimensions can be obtained.

In another implementation, multiple pillar local oscillators/resonators are used on one or both free surfaces of a base thin-film material with each including a unique (distinct) height and/or cross-sectional area (see, for example, FIGS. 2D and 2E). In this implementation, utilization of multiple pillars (above and/or below the thin film), each of which has a distinct geometrical dimension (in terms of the height and/or the cross-sectional area) provides multiple distinct resonance sets, and the more resonant sets the more couplings/hybridizations/interactions that take place across the spectrum and this in turn leads to the reduction in the group velocity for a larger number of phonons, and consequently a larger reduction in the overall thermal conductivity.

Theoretical/computational prediction/analysis of performance using supercell lattice dynamics and fitting to experimental data for uniform thin films can be used to obtain the optimal dimensions for various implementations. The theoretical/computational technique presented herein provide a method for the prediction/analysis of performance to determine optimal dimensions of the unit cell, and also serve as means for demonstration of a proof of concept. This process involves both atomic-scale lattice dynamics calculations and finite-element based lattice dynamics calculations for relatively large models, as well as the use of experimental data for uniform thin films to provide a conservative estimate of the scattering parameters in the thermal conductivity model used. (The thermal conductivity model used is given in Equation (1) below and is based on the Boltzmann Transport Equation under the time relaxation approximation).

A nanophononic metamaterial may be fabricated using a number of techniques, such as at least one of the following group: deposition, physical vapor deposition, chemical vapor deposition, electrochemical deposition, molecular beam epitaxy, atomic layer deposition, removal, etching, wet etching, dry etching, chemical-mechanical planarization, patterning, lithography, ion beam lithography, nano-architecting lattice structures and using nanolattices as a scaffold on which to pattern thermoelectric materials, and the like. In one particular implementation, for example, ion beam lithography or etching techniques may be used for mass production, although other techniques, such as but not limited to the ones listed above, are also possible. In one particular implementation, for example, a nanophononic metamaterial is fabricated using ion beam lithography. However, in another implementation (e.g., for mass production), techniques such as dry etching and metal assisted chemical (wet) etching may be used.

In particular example implementations described herein, for both functional and practical purposes, silicon thin films are used as a foundation material for the creation of a locally resonant NPM, however, other semiconducting materials, nanocomposites, and other types of nanostructured materials are not only contemplated but are expected to be used in different implementations. Using a reduced dimension material such as a thin film already causes a reduction of k of up to an order of magnitude without necessarily impacting $S^2\sigma$, and is also favorable from the point of view of device integration. The choice of silicon in these particular implementations is beneficial due to its wide use in the electronics industry and ease of fabrication; however, other materials may also be used in other implementations as described herein.

In one implementations, oscillators/resonators take the form of a periodic array of nanoscale pillars that extend/extrude/protrude off the surface of the thin film (on either one side or both sides, in various implementations as practically permitted). Such structures may be fabricated, for example, using techniques such as dry etching and metal assisted chemical (wet) etching, although other techniques are also contemplated. One advantage of an implementation using pillar-shaped protrusions, for example, is that the pillars exhibit numerous local resonances that couple, or more specifically, hybridize with an underlying atomic-level phonon dispersion of a thin film and do so across a full range of its spectrum. These couplings drastically lower the group velocities (at locations where the hybridizations take place) and, consequently, the thermal conductivity. This phenomenon is also known as avoided crossing, which has been studied in naturally occurring materials that have guest atoms encapsulated in caged structures such as clathrates. In contrast to an NPM, however, the hybridizations in these caged-structure systems are limited to the modes of the guest atom and typically take place only across a narrow band within the acoustic range of the spectrum. Another important benefit to utilizing pillars is that the feature manipulating the group velocities (i.e., the pillar or other protrusion itself) is physically outside of the primary flow path of the electrons (which resides in the main body of the thin film). This provides an advantage compared to thin-film-based NPCs, in which the inclusions or the holes penetrate through the thickness of the thin film and, hence, may undesirably cause an obstruction to electron transport through the film in addition to scattering the phonons. Furthermore, in this particular implementation, a concern about competition between coherent and nanofeature-induced incoherent thermal transport is no longer of critical importance because the local resonances are phase independent. This quality provides yet another practical benefit as it frees the NPM from restrictions on geometric tolerances.

In one particular implementation, an atomic-level unit cell model for a uniform silicon thin film with thickness is provided. In this implementation, a conventional cell (CC) description which consists of eight atoms packaged as a cube with side length a=0.54 nm is provided. Because of this conveniently shaped boxlike structure, the CC is used as a building block in this implementation and replicated along an orthogonal simple cubic lattice to generate a supercell for a thin-film structure. This is done for the uniform thin film and will be built upon later in this description when a pillar is added to the free surface(s). For the uniform thin film, the supercell consists of a vertical strip constructed by stacking M CCs on top of each other along the out-of-plane z direction. The dimensions of this supercell will be denoted by $A_x \times A_y \times A_z$, where $A_x=A_y=a$ and $A_z=Ma=t$.

In one particular implementation, a full phonon band structure for a set of suspended uniform silicon thin films is obtained by running atomic scale lattice dynamics (LD) calculations in which a three body Tersoff potential is used for the Si—Si bonds with only the first nearest neighboring interactions considered. All calculations in this implementation are conducted after minimizing the interatomic potential energy at constant pressure. For thermal conductivity predictions, the Boltzmann transport model can be used (using a Callaway Holland approach for modeling the scattering), which is expressed as $$k = \frac{1}{A_z \pi} \sum_\lambda \int_0^{\pi/A_x} C(\kappa, \lambda) v_g^2(\kappa, \lambda) \tau(\kappa, \lambda) \kappa \, d\kappa \quad (1)$$

along the x-direction-aligned ΓX path, where $\kappa$, $\lambda$, C, and $v_g$, an $\tau$ denote the phonon wave number, branch index, specific heat, group velocity, and scattering time, respectively. The three latter quantities are dependent on the phonon dispersion. The specific heat is expressed as $C(\kappa, \lambda) = k_B[\hbar\omega(\kappa,\lambda)/k_B T]^2 f(\kappa,\lambda)$, where $f(\kappa,\lambda) = e^{\hbar\omega(\kappa,\lambda)/k_B T}/[e^{\hbar\omega(\kappa,\lambda)/k_B T}-1]^2$, $\omega$ is the frequency, T is the temperature, $k_B$ is the Boltzmann constant, and $\hbar$ is the reduced Plank's constant. The group velocity is expressed as $v_g(\kappa,\lambda) = \partial\omega(\kappa,\lambda)/\partial\kappa$ and the scattering time as $\tau(\kappa,\lambda) = [\tau_U^{-1}(\kappa,\lambda) + \tau_I^{-1}(\kappa,\lambda) + \tau_B^{-1}(\kappa,\lambda)]^{-1}$, where $\tau_U^{-1}(\kappa,\lambda) = AT\omega^2(\kappa,\lambda)e^{-B/T}$, $\tau_I^{-1}(\kappa,\lambda) = D\omega^4(\kappa,\lambda)$, and $\Lambda_B^{-1}(\kappa,\lambda) = |v_g|/L$, representing umklapp, impurity, and boundary scattering, respectively. Note that Equation (1) is evaluated along the x-direction ΓX path.

In one implementation, the parameters A, B, and D are all obtained empirically. For A and B, measured data for uniform silicon thin films on a substrate is utilized since temperature-dependent trends are similar to their suspended counterparts. Concerning impurity scattering, $D=1.32 \times 10^{-45}$ s$^3$ can be used in this implementation. The effective boundary scattering length L is defined as $L=t/(1-p)$, where p is a surface specularity parameter ($0 \leq p \leq 1$). Because of the high sensitivity of the fitting parameters to the thin-film thickness (especially for very low t), model can be fit for a variety of thicknesses (e.g., t=20, 30, 50, 100, 420 nm) around a predetermined temperature (e.g., T=300 K).

In one implementation, demonstration of a proof of concept in which a presence of nanoscale resonating pillars (or other protrusions) reduces thermal conductivity in a thin film is described. In this implementation, a thin-film thickness is extremely small. A baseline study for this example case includes a thin-film supercell with a square base of 6×6 CCs ($A_x = A_y = a_{NPM} = 3.26$ nm) and a thickness of M 5 CCs ($A_z = t = 2.72$ nm); this corresponds to a rectangular solid containing 1440 atoms. A pillar is placed at the top of the thin film and has a square base of 2×2 CCs (side length of d=1.09 nm) and a height of 3 CCs (h=1.63 nm) and itself contains 96 atoms. The geometrical configuration of both supercells of this example implementation is shown in the insets of FIG. 1 and also at the bottom of FIGS. 5A and 5B, A phonon dispersion along the ΓX path is presented in the same figure for both the uniform thin film and the pillared thin film. For the thermal conductivity predictions in this implementation, the umklapp scattering parameters are kept constant between the uniform and pillared cases. This provides a conservative approximation for the latter since it has been shown that avoided crossings cause a slight reduction of phonon lifetimes. Boundary scattering parameters are also kept constant since the pillars in this implementation are relatively small in the cross-sectional area and are external to the main cross section of the nominal thin film; and they are, therefore, not expected to cause a significant deviation from the uniform thin-film boundary scattering parameters. For this model, appropriately fitted A and B parameters are used for a t=2.72-nm thin film using the experimental data in K. E. Goodson and Y. S. Ju, *Annu. Rev. Mater. Sci.* 29, 261 (1999); W. J. Liu and M. Asheghi, *Appl. Phys. Lett.* 84, 3819 (2004); and *J. Appl. Phys.* 98, 123523 (2005) (and as described further herein) and consider the case of p=0.

FIG. 1, including FIGS. 1(a) and 1(b), shows a comparison of the phonon dispersion and thermal conductivity of a pillared silicon thin film with a corresponding uniform thin film. The dispersion curves, in this implementation, are colored to represent the modal contribution to the cumulative thermal conductivity, normalized with respect to the highest modal contribution in either configuration. The full spectrum is shown in (a) and a close up view of the $0 \leq \omega \leq 2.5$ THz frequency range portion is shown in 1(b). Phonon DOS and the thermal conductivity, in both differential and cumulative forms, are also shown. The gray regions represent the difference in quantity of interest between the two configurations. The introduction of the pillar in the unit cell causes striking changes to all these quantities. FIG. 1 shows results of the proof of concept implementation. As can be seen in FIG. 1: (i) The lower (acoustic) branches contribute to a significant portion of the thermal conductivity in both the uniform and pillared thin films. In addition, we see that the higher wave numbers also significantly contribute to the thermal conductivity. One factor to recall here is that the boundary scattering term has been set to the thin-film thickness, i.e., L=t=2.72 nm. When this value is very small, the long waves (i.e., those near the Γ point in the band diagram) are effectively eliminated and, as a result, the low contribution is obtained at the low wave number end of the acoustic branches, (ii) The presence of the pillars causes a series of flat locally resonant phonon modes to appear across the entire spectrum, i.e., at both subwavelength and superwavelength frequencies. These modes interact with the underlying acoustic and optical thin-film phonon modes and form a hybridization of the dispersion curves. This in turn leads to a flattening of the branches at the intersections and hence a reduction in the group velocities and the thermal conductivity. The introduction of the pillars reduces the thermal conductivity to 48% of that of the uniform thin film. This is a remarkable outcome considering that the pillars introduce 288 new degrees of freedom per unit cell, each of which add one more branch to the summation carried out in Equation (1), Thus even though more phonons are added to the system, less energy is actually carried due to the hybridization mechanism. (iii) We note that the branches under 1.5 THz (mostly acoustic branches) for the uniform case contribute approximately to 40% of the thermal conductivity. The presence of the pillars significantly modifies the relative contribution of these branches, which now contribute to roughly 60% of the thermal conductivity. With the pillars, nearly 70% of the thermal conductivity is accounted for by phonons below 2.5 THz compared to 60% without pillars. For the pillared case, the vast majority of this 70% falls within the range $0.5 < \omega \leq 2.5$ THz. The remaining 30% are mostly accounted for in the range $2.5 < \omega \leq 10$ THz. These results indicate that the flattening effect caused by the numerous local resonances on the dense high frequency optical modes causes the contribution profile to shift downwards, allowing the acoustic and low frequency optical modes to carry more weight. However, at very high frequencies (above 10 THz), the thin-film dispersion curves are already too flat, providing the horizontal resonant branches little opportunity for any noticeable alteration of the group velocities.

In these implementations, modeling of the dispersion of the thin film was performed with pillar-shaped protrusions utilizing atomic-scale LD. However, due to the profound computational intensity associated with solving large complex eigenvalue problems, the model used in these implementations was limited to very small sizes, although larger models could also be performed with additional computing resources. In the particular example implementation described above, however, a model approximately on the order of 5 nm in supercell side length was used. Given that current nanostructure fabrication technology is practically limited to minimum feature sizes roughly an order of magnitude larger, a continuum-based finite-element (FE) model was also used for LD calculations, although special attention was paid to the FE resolution in terms of the number of elements per CC, $n_{ele}$/CC, when compared to the atomic scale model. To understand the sensitivity of the thermal conductivity prediction to the FE resolution, comparisons of results obtained by both FE and atomic-scale LD models are included below, From these results it is noted that with increased FE resolution, the FE model maintains a consistent trend and approaches the atomic-scale LD model. Also examined below is the FE performance for a larger model (for which atomic-scale LD results are not available) and again a converging trend is observed.

Identical scattering parameters were also used for the uniform and pillared models, noting that this approximation improves with an increase in thin-film thickness. The results appear in FIG. 4 for a NPM with pillars on either one surface or on the two surfaces and for the uniform thin film. Note a few distinctive traits in these results: (i) consistent with FIG. 1, the maximum frequency between the uniform and pillared cases remains the same despite the extra branches that get introduced due to the added FE degrees of freedom of the pillar, and (ii) despite this addition of degrees of freedom, once again the NPM has a reduced thermal conductivity (59% of the uniform thin film's value) due to the penetration of the local resonance branches into the phonon spectrum, With a higher FE resolution, the predicted reduction is expected to increase (see below). For the double pillared thin film, additional flat branches appear around the resonant frequencies. This points to a breakage of the degeneracy for the locally resonant modes, which is likely due to numerical errors associated with solving the eigenvalue problem. This effect causes further reduction in the thermal conductivity to 51% of the uniform, thin film's value. In order to examine the effect of the choice of the umklapp scattering parameters, these calculations were repeated using values for bulk silicon ($A=2.10\times10^{-19}$ s/K and $B=180$ K; see B. L. Davis and M. I. Hussein, AIP Advances 1, 041701, 2011) and obtained $k_{Pillared}/k_{Uniform}$ values of 60% and 54% for the single and doubled pillared thin films, respectively. These numbers are very close to those reported above using the thin-film parameters because at a thickness of $t=50$ nm, the umklapp scattering behavior approaches that of the bulk material. Finally, the analysis was repeated with a specularity parameter of $p=1$ and resulted in $k_{Pillared}/k_{uniform}$ values of 76% and 73% for the single and doubled pillared thin films, respectively (using recalculated thin-film umklapp scattering parameters, $A=1.20\times10^{-18}$ s/K and $B=15$ K, which were obtained using $p=1$).

Locally resonant acoustic metamaterials have been investigated to control acoustic waves in macroscale applications where characteristic size is on the order of microns or larger. In the present applications, however, a locally resonant NPM is provided to control heat waves. In acoustics, local resonances couple with the dispersion curves associated with the periodic arrangement of the oscillators/resonators, or the long wave linear dispersion of the embedding medium when looking only at the subwavelength regime. In the thermal applications discussed herein, the coupling is between the local resonance modes and the atomic-scale dispersion of the underlying crystalline material. Acoustic metamaterials, like their electromagnetic counterparts, derive their unique properties at subwavelength frequencies. In NPMs, the local resonances produce desirable effects across the entire spectrum, including the superwavelength regime. Indeed, despite the injection of additional phonons (associated with the added degrees of freedom of the oscillators/resonators), the thermal conductivity has been reduced, and this is attributed to the hybridizations taking place at both subwavelength and superwavelength frequencies. This outcome provides a broader perspective to the definition of a metamaterial. Finally, in the particular implementation of the NPM configuration based on pillared thin films, a powerful mechanism for reducing the thermal conductivity is provided without altering the base thin-film material (e.g., without the insertion of boundary-type scatterers such as holes, inclusions, interfaces, impurities, etc.) and is therefore expected to have a minimal effect on the electrical conductivity. This scenario is markedly advantageous for thermoelectric energy conversion. In this implementation, models provide a conservative prediction of thermal conductivity reduction by as high as a factor of 2 compared to a corresponding uniform thin film. Upon analysis with higher resolution models, optimization of dimensions, exploration of other base material and local oscillator/resonator material and geometric configurations, merging of the local oscillator/resonator (e.g., pillars) concept with other 2D (or 1D or 3D) base materials that originally (i.e., without the oscillators/resonators) have good thermoelectric properties, among other factors, it is perceivable to reach exceedingly high values of ZT using the concept of a nanophononic metamaterial.

Thin Film Umklapp Scattering Parameters

Figure 6:
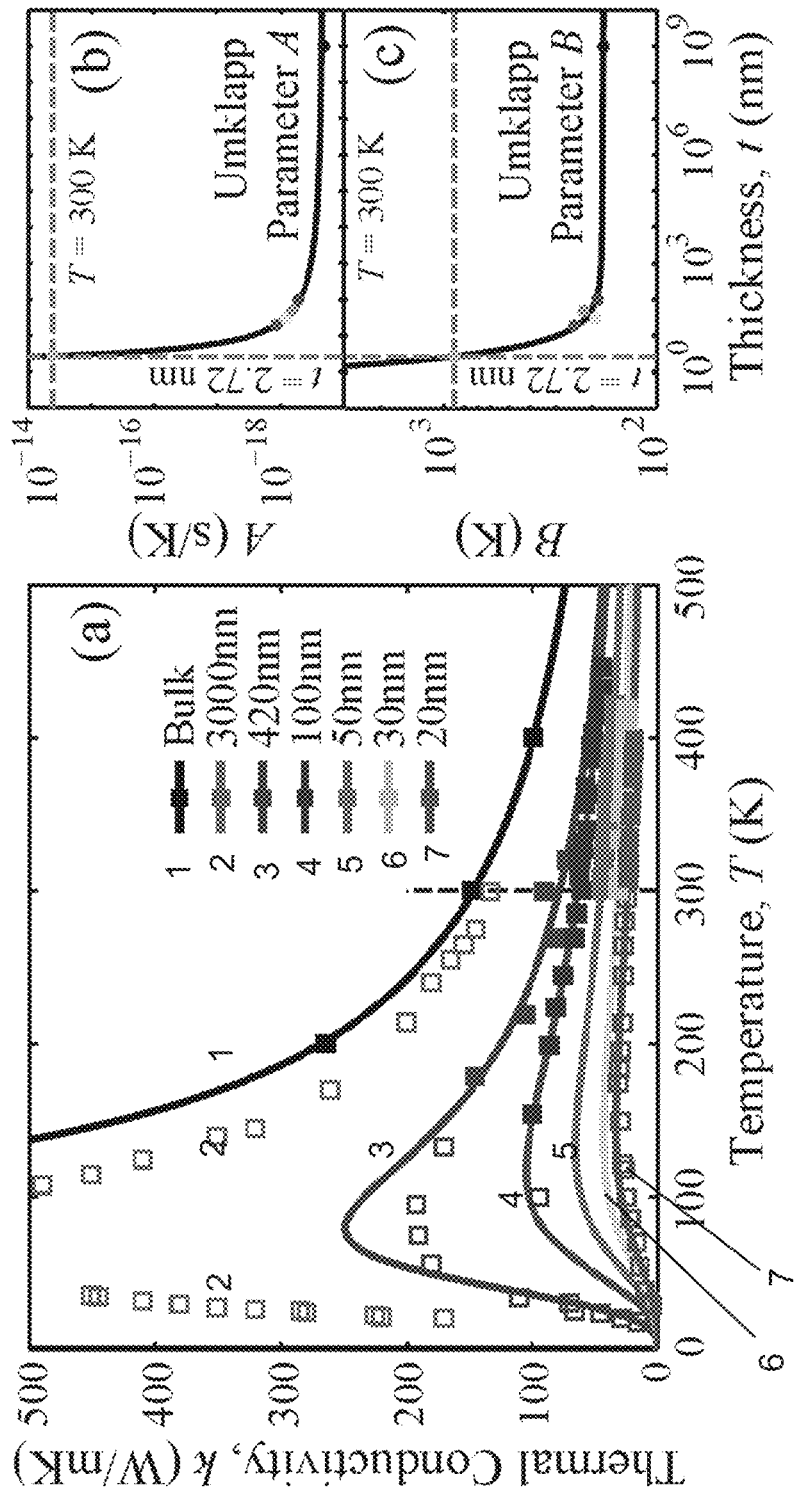
FIG. 6 shows (a) Thermal conductivity as a function of T for various thin films. The squares are measurements (K. E. Goodson and Y. S. Ju, *Anna. Rev. Mater. Sci.* 29, 261 (1999); W. J. Liu and M. Asheghi, *Appl. Phys. Lett.* 84, 3819 (2004); *J. Appl. Phys.* 98, 123523 (2005)) and the solid lines represent the fitted model. The subfigures (b) and (c) show Umklapp scattering parameters, A and B, respectively, as a function of t at room temperature. These parameters are determined by fitting the thermal conductivity predictions with the empirical data points shown in (a). The C—H 2D thermal conductivity formulation, reinforced with full dispersion information, is shown to represent the experimental values very well for various t values. For thin films with thickness smaller than that is empirically available, an extrapolation is carried out. This is demonstrated in (b) and (c) for the thickness value of t=2:72 nm, where $A=4:14 \times 10^{-15}$ s/K and B=899 K.

In one implementation, a thermal conductivity prediction Callaway-Holland (C-H) model (see J. Callaway, *Phys. Rev.* 113, 1046 (1959); M. G. Holland, ibid. 132, 2461 (1963)) to experimental data provided in K. E. Goodson and Y. S. Ju, *Annu. Rev. Mater. Sci.* 29, 261 (1999); W. J. Liu and M. Asheghi, *Appl. Phys. Lett.* 84, 3819 (2004); and *J. Appl. Phys.* 98, 123523 (2005) was fit in order to obtain estimates for the Umklapp scattering parameters, A and B. In this implementation, the model was fitted for a variety of thicknesses, t=20; 30; 50; 100; 420 nm, around a temperature of T=300K. FIG. 6a shows the empirical data used (marked with square dots) as well as the results from the model for the case of zero surface specularity, i.e., p=0. It is noted that due to the limited availability of data across a wide temperature range, and the inconsistency in the number of data points available for each thickness, only the solid dots were considered for the fitting. This ensures the expected trends at T=300K while simultaneously providing a consistent asymptotic behavior at high temperatures whereby the order of the curves is maintained according to the thickness value for each curve. Upon obtaining the parameter values for an adequate number of thin-film thicknesses, a second level of curve fitting is performed to harness scattering parameters for a wide range of thin-films as shown in FIGS. 6b and 6c (see B. L. Davis, M. F. Su, I. El-Kady, and M. I. Hussein, Proc. ASME IMECE, IMECE2012-89902 (2012) for further details on this two-step fitting process).

Finite-Element Resolution Analysis of Thin-Film Models

Figure 7:
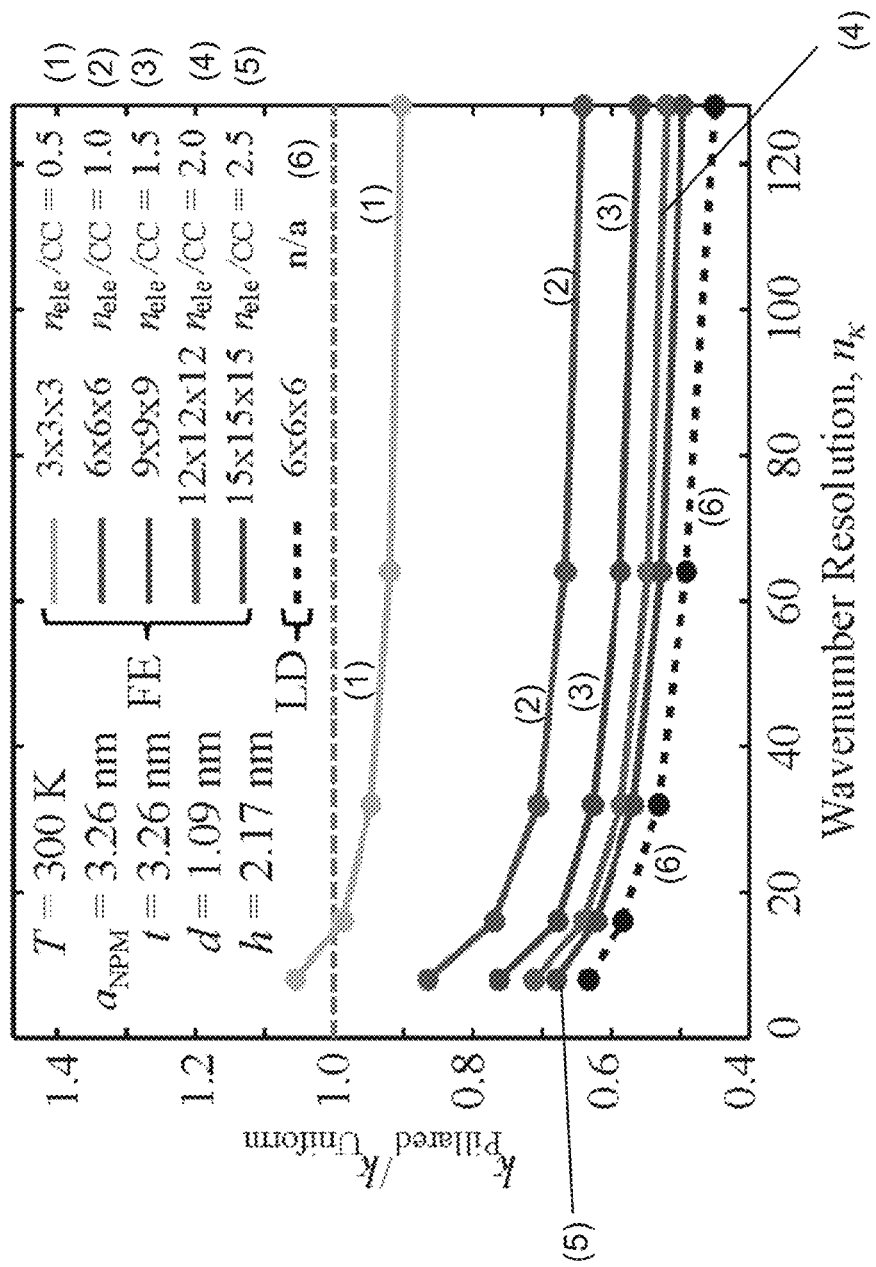
FIG. 7 shows Comparison of the thermal conductivity of a t=3:26-nm thin film with and without the presence of pillars utilizing FE of varying $n_{ele}$=CC and $n_\kappa$ solutions (solid lines). The unit cell dimensions of the FE model are equivalent to a corresponding atomic-scale LD model (dashed line) to enable a direct comparison.

We consider a supercell whose thin-film base has a thickness of $A_z=t=3:26$ nm ($A=4.17\times10^{-16}$ s/K, B=705 K and p=0) and the rest of the dimensions as given in FIG. 7. These dimensions are selected to enable a comparison with an atomic-scale LD supercell model with a thin-film base composed of 6 conventional cells (CC) and a pillar base and height formed from 2 and 4 CC, respectively. For the finite-element (FE) model, three-dimensional cubic elements were used. In FIG. 7, we directly compare the reduction in the thermal conductivity for the thin-film with pillars normalized with respect to the uniform case, for various FE resolutions, $n_{ele}$=CC (where $n_{ele}$ is the number of finite elements), and wavenumber discretization resolutions, $n_k$. First, we find that as we increase $n_k$ (which numerically improves the prediction of the C-H model), the thermal conductivity converges to a constant value. Second, when $n_{ele}$=CC is increased, the reduction in the thermal conductivity due to the presence of the pillars increases and also converges to a constant value. As we saw in the smaller-sized problem of FIG. 1, the overall effects of the coupling/hybridizations/interactions are relatively higher on the optical modes than on the low-frequency modes due to the large number of local resonances penetrating into a high density of optical branches. Consequently, since more optical branches appear with an increase in FE resolution an improvement in the thermal conductivity reduction was observed. Finally, with increased FE resolution, the FE model maintains a consistent trend and approaches the atomic-scale LD model. This provides confidence that, for a given resolution, the FE model conservatively captures the nanoscale phonon dynamics behavior as far as the effects of the pillars on the overall dispersion, and hence the thermal conductivity reduction, are concerned.

Figure 8:
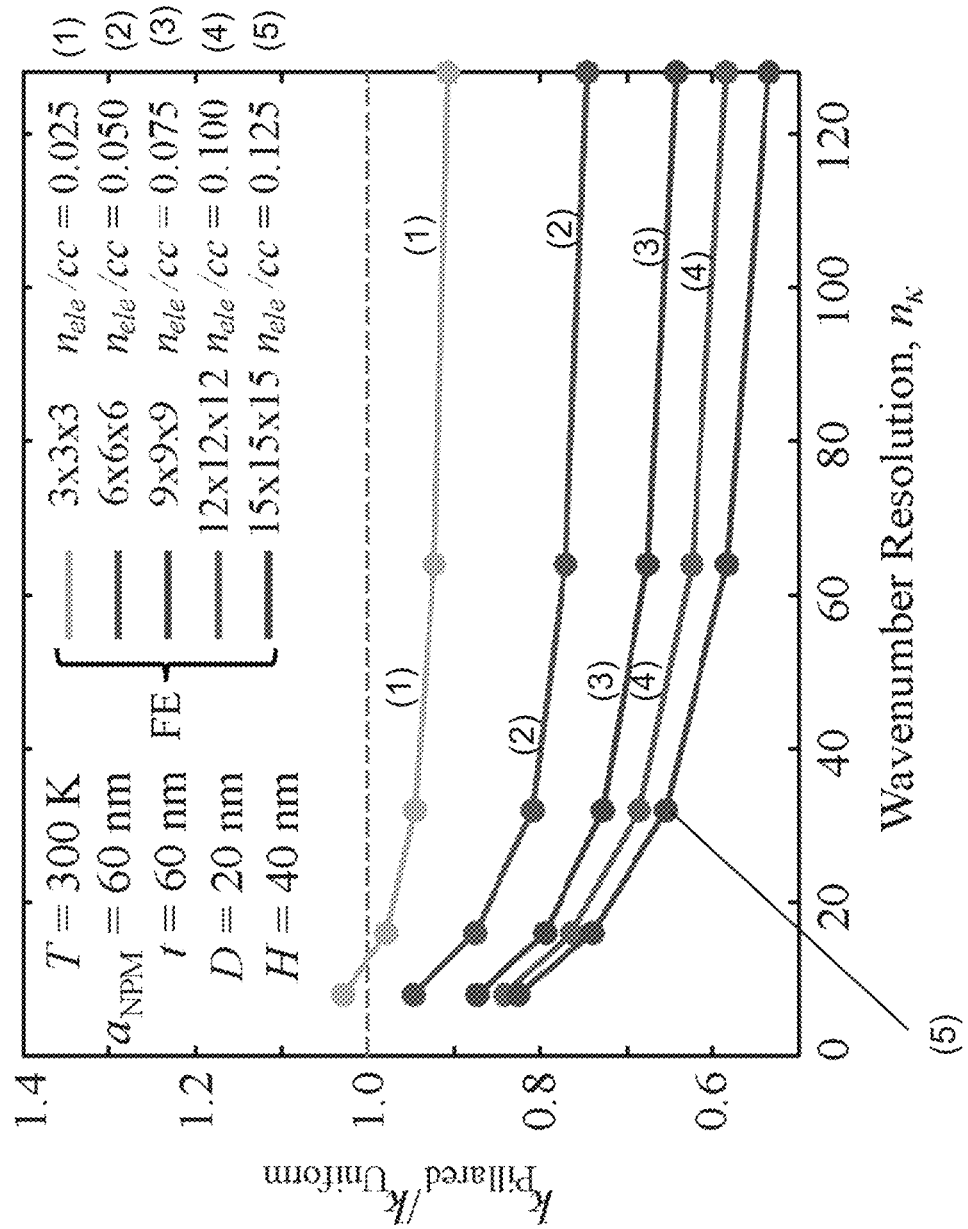
FIG. 8 shows a comparison of the thermal conductivity of a t=60-nm thin film with and without the presence of pillars utilizing FE of varying $n_{ele}$=CC and $n_\kappa$ resolutions. The steady but slow rate of convergence observed indicates that upon further increase in FE resolution, the relative thermal conductivity, $k_{Pillared}=k_{Uniform}$, is expected to decrease substantially.

Upon proceeding to a thin-film model with a larger thickness, it is difficult to maintain the same level of FE resolution due to limitation of computational resources. To examine the convergence performance under such limitation, a larger thin-film model using substantially lower $n_{ele}$=CC values was analyzed. Uniform and pillared thin-films with a thickness of t=60 nm ($A=5:90\times10^{-19}$ s/K, B=200 K and p=0) were selected. The NPM supercell here has a base length of $a_{NPM}=60$ nm, a pillar width of d=20 nm and a pillar height of h=40 nm. The results are shown in FIG. 8 where a reduction in the thermal conductivity is observed. FIG. 8 also displays a converging trend as that is shown in FIG. 7 except that the rate of convergence is slower. This in fact suggests that if the $n_{ele}$/CC resolution is increased further, a substantial additional reduction in the thermal conductivity of the NPM compared to the uniform thin-film case is to be expected. Upon comparing with bulk silicon, this estimated relative reduction is to be added to a reduction of roughly a factor 3 (attributed to the transitioning from bulk to a thin-film configuration) as suggested by FIG. 6a.

Although pillar-shaped protrusions that function as local oscillators/resonators are discussed in various example implementations, many types and shapes of local oscillators/resonators (e.g., protrusions extending from a surface of a contiguous solid medium, such as a thin film, or localized oscillators/resonators embedded within the main body of a contiguous solid medium) are contemplated and may be interchanged, in whole or in part, with other implementations described. FIGS. 2, 3, 5A, 5B and 9 through 14, for example, demonstrate a variety of geometrical configurations for a nanophononic metamaterial as described herein. In these implementations, for example, a contiguous, solid medium serving as a skeleton (in various implementations, for example, the medium may be composed of a semiconducting material or any type of a crystalline or at least partially crystalline material or composite with relatively good raw thermoelectric properties) and an assembly of substructures that serve as local resonators/oscillators are provided. In one implementation, for example, the main body or skeleton takes the form of a 3D (bulk), 2D (thin-film, sheet, membrane or plate) or 1D (wire, rod, column or beam) medium. Furthermore, in one implementation, for example, the surfaces of a 3D main body may be straight or curves, and, similarly, the surfaces, or the centerline along the thin sections, of a 2D or a 1D main body may be straight or curved. The oscillators/resonators can take a variety of distributions, shapes and sizes as shown in the drawings and could lie within the main body or extrude out of the main body. Furthermore, the oscillators/resonators can take a variety of orientations and material compositions. The oscillators/resonators could be distributed in a perfectly periodic fashion, randomly, or in any other manner. The geometric dimensions of the oscillators/resonators could be identical, or could vary within a group whereby the entire group repeats in an identical fashion, or could vary in random fashion, or could be arranged in any other pattern or manner.

It should be noted that in addition to the configurations shown in each sub-figure, it is possible to mix and match various features from different sub-figures. For example, having oscillators/resonators on both the top and bottom sides of a thin film as shown in FIGS. 2A and 2B may be applied to all the other cases showing thin-films, such as the multi-pillared thin films shown in FIGS. 2D and 2E. Furthermore, the relative dimensions of all features, as well as the relative spacing between the features, shown in all the figures could be varied and it is also possible to use different materials for the main body versus the oscillators/resonators.

A choice to be made between the various configurations may depend on one or more of several factors such as thermoelectric energy conversion performance, stability, toxicity, ease of fabrication and scalable manufacturing, ease and suitability of integration into a thermoelectric device, cost, among other factors.

Figure 3:
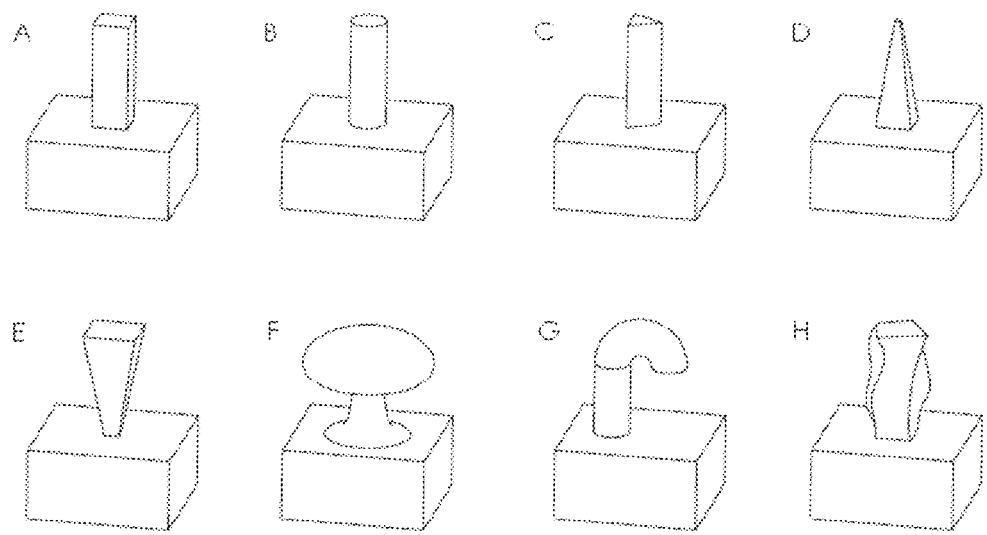
FIG. 3 depicts a variety of 1D locally resonant oscillator geometries/shapes of the type that extends from a base material.

FIG. 3, including FIGS. 6A through 6H, show a plurality of example implementations of pillar-shaped protrusions forming local oscillators/resonators on one or more surfaces of a contiguous solid medium (e.g., a 3D bulk medium, a 2D thin-film, sheet, membrane or plate medium or a 1D wire, rod, column or beam medium). FIG. 2A, for example, shows different perspective views of one implementation of a thin film medium including a generally two-dimensional (2D) uniform, periodic array of equal-sized pillars disposed on a single surface (e.g., a top surface) of the thin-film medium. Although the pillars are shown in FIG. 2A to have a square cross-section, they can have any other cross-sectional shape such as rectangle, circle, oval, triangle, polygon or other regular or irregular cross-sectional shape (see, for example, cross sections depicted in FIG. 3).

FIG. 2B similarly show different perspective views of a second implementation of a generally two-dimensional (2D) thin-film medium including a periodic, uniform array of equal-sized, pillars disposed on two sides/surfaces (e.g., top and bottom surfaces) of the thin-film medium. In this implementation, the size of the pillars on a first side of the medium (e.g., top pillars) could be equal to or different than the size of the pillars on a second side of the medium (e.g., bottom pillars). In addition, although the pillars are shown in FIG. 2B to have a square cross-section, they can have any other cross-sectional shape such as rectangle, circle, oval, triangle, polygon or other regular or irregular cross-sectional shape (see, for example, cross sections depicted in FIG. 3).

FIG. 2C show different perspective views of a third implementation of a generally two-dimensional (2D) thin-film medium with a periodic array of equal-sized pillars disposed on a first surface of the thin-film medium (e.g., on a top surface) with an empty row appearing every n number of rows (e.g., every third row in the implementation shown in FIG. 2C). Other distributions of full and empty rows, and columns, could also be employed.

FIG. 2D show different perspective views of a fourth implementation of a generally two-dimensional thin-film medium with a periodic array based on a multi-pillared unit cell having pillars with different heights. In the particular example shown in FIG. 2D, for example, each repeated unit cell has multiple pillars each of a different height but the same cross-sectional area and/or shape. In a different implementation, each repeated unit cell could have multiple pillars of different heights and also different cross-sectional areas. While in this configuration, there are four pillars in each unit cell, other configurations could include a larger or smaller number of pillars per unit cell, distributed on only one side or both sides of the thin film.

FIG. 2E shows different perspectives of a fifth implementation of a generally two-dimensional thin-film medium with a periodic array based on a multi-pillared unit cell having pillars with different cross-sectional areas. In the particular example shown in FIG. 2E, for example, each repeated unit cell has multiple pillars each of a different cross-sectional area but the same height and/or shape. In a different implementation, each repeated unit cell could have multiple pillars of different cross-sectional areas and also different heights and/or shapes. While in this configuration, there are four pillars in each unit cell, other configurations could include a larger or smaller number of pillars per unit cell.

FIG. 9A show different perspective views of a sixth implementation of a generally two-dimensional (2D) thin-film medium including a two-dimensional (2D) periodic array of pillars disposed on a first and second surface of the thin-film medium (e.g., on a top surface and a bottom surface of the medium) in which a thickness (e.g., diameter) of the pillars vary randomly across different locations on the surface of the medium. In this implementation, the pillars on each side have same height, and the height of each pillar at the top is different than at the bottom. In another implementation, the height of each pillar at the top could be the same as at the bottom. Although pillars are shown on two sides in FIG. 9A, another implementation may have a similar configuration of pillars but on a single side only.

FIG. 9B show different perspective views of a seventh implementation of a generally two-dimensional (2D) thin-film medium including a two-dimensional (2D) periodic array of pillars disposed on a first and second surface of the thin-film medium (e.g., on a top surface and a bottom surface of the medium) in which a height of the pillars vary randomly across different locations on the surface of the medium. In this implementation, the pillars on each side have the same thickness (e.g., diameter), and the thickness of each pillar at the top is the same than at the bottom. In another implementation, the thickness of each pillar at the top could be different than at the bottom. Although pillars are shown on two sides in FIG. 9A, another implementation may have a similar configuration of pillars but on a single side only.

FIG. 9C show different perspective views of an eighth implementation of a generally two-dimensional (2D) thin-film medium including pillars disposed on a single surface (e.g., on a top surface) and whose positions and heights are random while their thicknesses are all the same. Although pillars are shown on a single side in FIG. 9C, another implementation may have a similar configuration of pillars but on two surfaces of a thin-film medium.

FIG. 9D show different perspective views of an ninth implementation of a generally two-dimensional (2D) thin-film medium including pillars disposed on a single surface (e.g., on a top surface) and whose positions and thicknesses are random while their heights are all the same Although pillars are shown on a single side in FIG. 9D, another implementation may have a similar configuration of pillars but on two surfaces of a thin-film medium.

FIG. 9E show different perspective views of a tenth implementation of a generally two-dimensional thin film medium including a random (i.e., non-periodic) array of pillars on a single surface (e.g., on a top surface) with the thickness (e.g., diameter), shapes and heights of the pillars varying randomly across the different sites. Although pillars are shown on a single side in FIG. 9E, another implementation may have a similar configuration of pillars but on two surfaces of a thin-film medium.

FIG. 9F show a configuration of an eleventh implementation based on a vertical stacking of the of the pillared thin-film material shown in FIG. 2A. The different features shown in other figures such as pillar spacing (see, for example, FIG. 2C), multi-pillar unit cell (see, for example, FIGS. 2D and 2E), walled configuration (see, for example, FIGS. 11A and 11B and their corresponding descriptions) and random pillars (see, for example, FIGS. 9A and 9D) may also apply to this vertical stacking configuration. While the figure shows, as an example three layers of pillared thin films stacked on top of each other, the number of layers of pillared thin films stacked could vary.

FIG. 10A show different perspective views of a twelfth implementation of a generally two-dimensional thin film medium including a bridged structure having a central cylinder supported by thin arms (e.g., beams). In this implementation, for example, the unit cell may be repeated to form a periodic or non-periodic array. The central cylinder (which could be of the same material as the main body of the thin film, or a heavier material) acts as a local oscillator/resonator in this configuration. Other shapes for oscillators/resonators in this configuration (e.g., square cylinder, sphere, others) may be employed, and the supporting arms also could have other shapes, number and orientations. This configuration concept could also be realized in the form of a 2D thick plate-like material with each oscillator/resonator taking the shape of a cylinder, or sphere or other shape.

FIG. 10B show different perspective views of a thirteenth implementation of a generally two-dimensional thin film medium with a periodic array of circular inclusions comprising a highly complaint material (i.e., a material that is significantly less stiff than the material from which the main body of the thin film is made). In this particular implementation, for example, each inclusion of a compliant material in this configuration may act as an oscillator/resonator (i.e., similar to each pillar in FIG. 2A). Other shapes and sizes for the inclusions may also be adopted. The sites of the compliant inclusions may be ordered in a periodic fashion (as shown) or may be randomly distributed (as in FIGS. 9C and 9D). Similarly, the size of each inclusion may be uniform or may vary in groups (as in FIGS. 2D and 2E) or vary randomly.

FIG. 11A show different perspective views of a fourteenth implementation of a generally two-dimensional (2D) thin film medium including a one-dimensional (1D) periodic array of equal-sized walls disposed on a first surface of the thin-film medium (e.g., a top surface of the thin-film medium). In this particular implementation, each wall acts as an oscillator/resonator representing a 2D version of a pillar. The walls have a uniform cross section along the length, but other configurations could have a periodically or non-periodically varying cross-section along the length of the wall. Although walls are shown on a single side in FIG. 11A, another implementation may have a similar configuration of walls but on two surfaces of a thin-film medium.

FIG. 11B show different perspective views of a fifteenth implementation of a generally two-dimensional (2D) thin film medium including a two-dimensional (2D) periodic array of equal-sized walls disposed on a first surface of the thin-film medium (e.g., a top surface of the thin-film medium). In this particular implementation, each wall acts as an oscillator/resonator representing a 2D version of a pillar. Each wall has a uniform cross section along the length, but other configurations could have a periodically or non-periodically varying cross-section along the length of each wall. The thickness of the vertical walls could be different than the thickness of the horizontal walls. Although walls are shown on a single side in FIG. 11B, another implementation may have a similar configuration of walls but on two surfaces of a thin-film medium.

FIG. 12A show different perspective views of a sixteenth implementation of a generally one-dimensional (1D) wire, rod, column or beam medium including a cyclic periodic array of equal-sized pillars disposed along the circumference of the main body medium. In this particular implementation, each pillar acts as an oscillator/resonator. In other implementations, the pillars may have other shapes. While in this configuration, eight pillars protrude at each lattice site, other configurations could include a larger or smaller number of pillars per lattice site.

FIG. 12B show different perspective views of a seventeenth implementation of a generally one-dimensional (1D) wire, rod, column or beam medium including a cyclic distribution of pillars of different heights disposed along the circumference of the main body medium. In this particular implementation, each pillar acts as an oscillator/resonator. In other implementations, the pillars may have other shapes. While in this configuration, four pillars protrude at each lattice site, other configurations could include a larger or smaller number of pillars per lattice site. Furthermore, in other implementations, the radial distribution of the pillars could be random. Furthermore, in other implementations, the heights of the pillars and/or shapes and/or thicknesses could be random along both the radial and axial directions.

FIG. 13A show different perspective views of a eighteenth implementation of a generally one-dimensional (1D) wire, rod, column or beam medium including a one-dimensional (1D) periodic array of cylinders disposed along the axis of the main body medium. In this particular implementation, each cylinder acts as an oscillator/resonator. In other implementations, the cylinders may have other shapes.

FIG. 13B show different perspective views of a nineteenth implementation of a generally one-dimensional (1D) wire, rod, column or beam medium including a one-dimensional (1D) periodic array where each unit cell consists of multiple cylinders of different diameters and/or thicknesses disposed along the along the axis of the main body medium. In this particular implementation, each cylinder acts as an oscillator/resonator. In other implementations, the cylinders may have other shapes. While in this configuration, there are three cylinders in each unit cell, other configurations could include a larger or smaller number of cylinders per unit cell. Furthermore, in other implementations, the size, shape and positioning of the cylinders along the axis of the main body may be random.

FIG. 3 show a variety of shapes and designs for a pillar. Any of these designs, or other shapes that would allow the pillar to function as an oscillator/resonator, may be applied in conjunction with the numerous design concepts/features shown FIGS. 2, 9 and 12.

FIG. 14A show different perspective views of a twentieth implementation of a 3D material configuration including a bridged structure having a central sphere supported by thin arms (e.g., beams). In this implementation, for example, the unit cell may be repeated to form a periodic or non-periodic array. The central sphere (which could be of the same material as the main body of the thin film, or a heavier material) acts as a local oscillator/resonator in this configuration. Other shapes for oscillators/resonators in this configuration (e.g., cubic sphere, cylinder, others) may be employed, and the supporting arms also could have other shapes, number and orientations. In analogy to the configuration shown in FIG. 10A (which is a 2D version), the sites of the local resonators may be ordered in a periodic fashion (as shown) or may be randomly distributed.

FIG. 14B show a 3D material configuration with a periodic array of cubic inclusions comprising a highly complaint material (i.e., a material that is significantly less stiff than the material from which the main body is made). The compliant material in this configuration acts as an oscillator/resonator (i.e., similar to the pillars in FIG. 2A). Other shapes for the inclusions may be adopted. In analogy to the configuration shown in FIG. 10B (which is a 2D version), the sites of the compliant inclusions may be ordered in a periodic fashion (as shown) or may be randomly distributed. Similarly, the size of each inclusion may be uniform or may vary in groups or vary randomly.

Figure 5A:
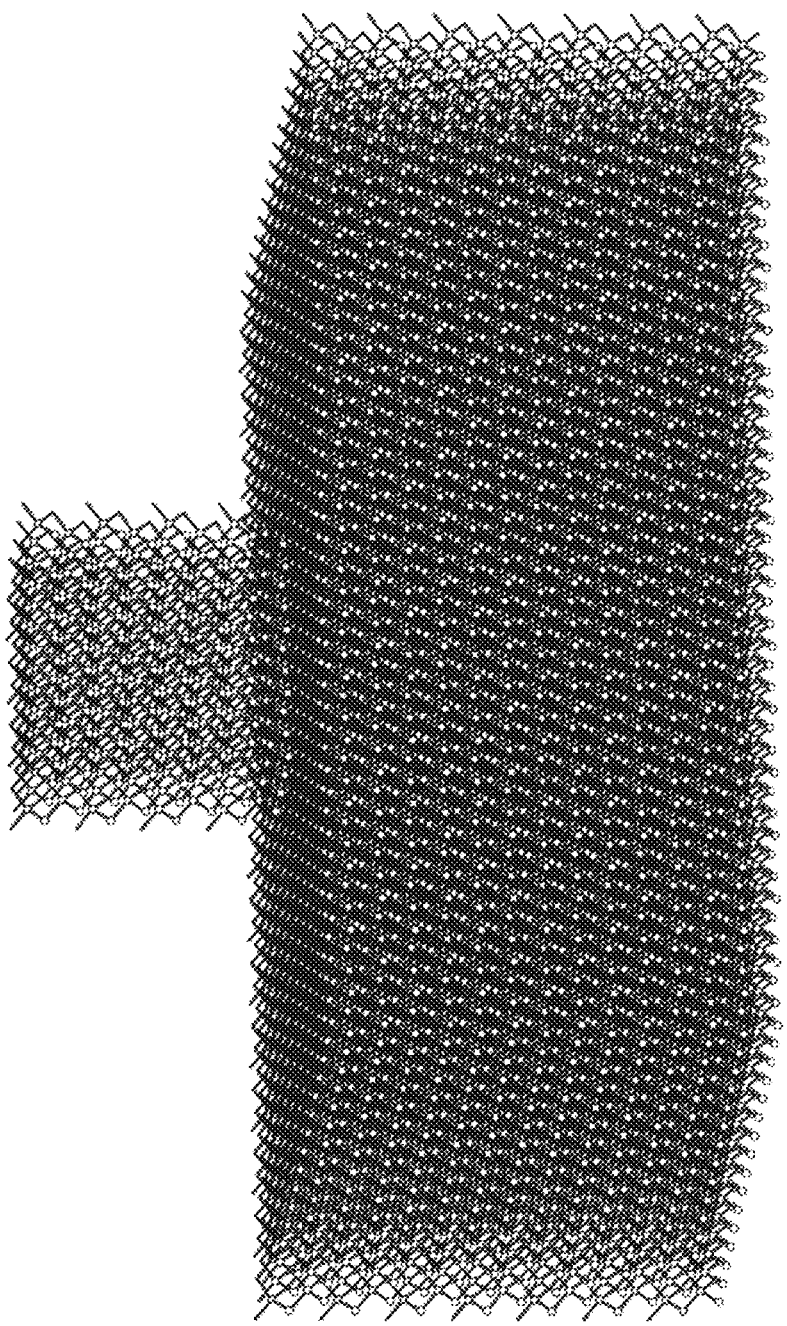
FIGS. 5A and 5B show images of unit cells of example implementations of a locally resonant NPM consisting of a pillar extending on top of a thin film. Each image shows an atomic-scale model of a unit cell where the thin film and the pillar are made out of single crystal silicon.
Figure 5B:
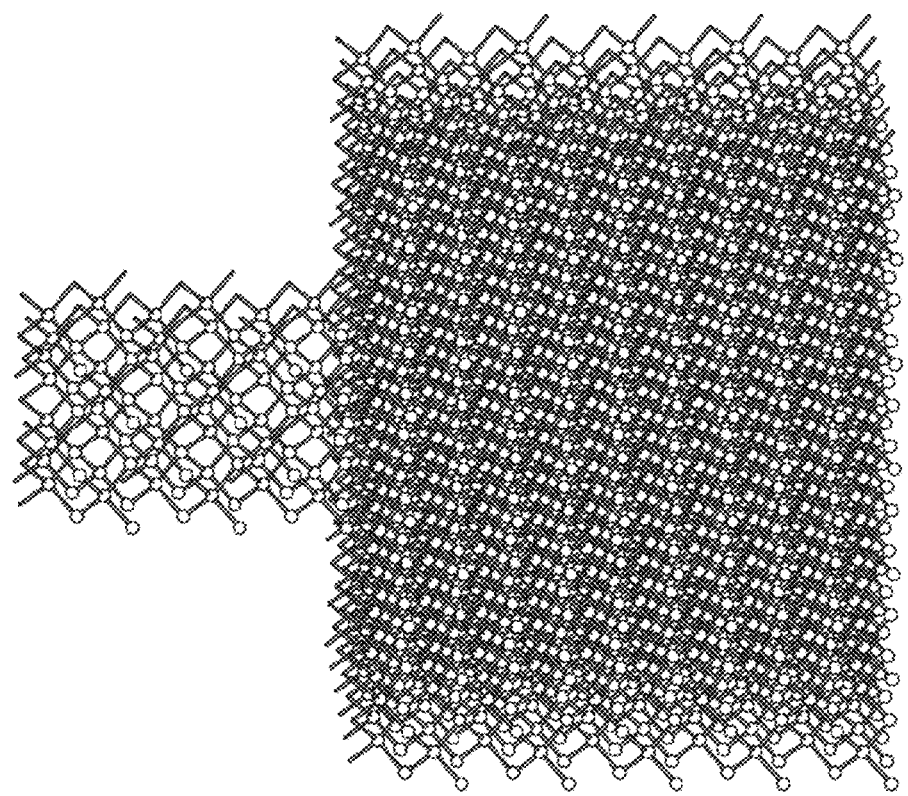

FIGS. 5A and 5B show images of an example implementations for which an atomic-scale model of a unit cell is similar to the one shown in FIG. 2A. In this particular implementation, the unit cell is made out of single crystal silicon. Other crystalline or at least partially crystalline materials may be employed and modeled in a similar manner.

Further descriptions of nanophononic metamaterials and methods for slowing group velocity of phonons traveling within a base material are further described in detail in: B. L. Davis and M. I. Hussein, *Physical Review Letters* 112, 055505 (2014), which is herein incorporated by reference in its entirety as if fully set forth herein.

Although multiple implementations of this invention have been described above with a certain degree of particularity, those skilled in the art could make numerous alterations to the disclosed implementations without departing from the spirit or scope of this invention. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A method for reducing thermal conductivity through an at least partially crystalline base material, the method comprising:
    generating a plurality of local vibration modes within the at least partially crystalline base material by the oscillation of at least one nanoscale locally resonant oscillator coupled to the base material;
    interacting at least one of the local vibration modes created by the at least one nanoscale locally resonant oscillator with a plurality of phonons moving within the base material slowing group velocities of at least a portion of the interacting phonons.

2. The method of claim 1 wherein the plurality of local vibration modes interact with an underlying lattice dispersion of the at least partially crystalline base material and the interaction of the at least one vibration mode and the plurality of phonons reduce the group velocities of the at least a portion of the interacting phonons at and near a coupling in a frequency between the vibration modes and the plurality of phonons.

3. The method of claim 1 wherein the at least partially crystalline base material comprises at least one of the group comprising: a semiconductor material, a silicon semiconductor material, a germanium semiconductor material, a gallium arsenide semiconductor material, a superlattice material, a nanocomposite material, a nanostructured nanocomposite material, a thermoelectric material, a nanostructured thermoelectric material, a nanostructured thermoelectric material including one or more holes or inclusions in a periodic or random spatial distribution within a body of the nanostructured thermoelectric material, a nanophononic crystal.

4. The method of claim 1 wherein the at least one nanoscale locally resonant oscillator comprises at least one nanoscale pillar extending from at least one surface of the base material.

5. The method of claim 4 wherein the extension of the at least one nanoscale locally resonant oscillator from at least one surface of the base material improves the thermoelectric energy conversion figure of merit, ZT, by freeing the at least partially crystalline base material from local resonators acting as internal scatterers that hinder motion of electrons and cause a reduction in electrical conductivity of the base material.

6. The method of claim 1 wherein the at least one nanoscale locally resonant oscillator comprises at least one oscillator disposed within the at least partially crystalline base material.

7. The method of claim 1 wherein the at least partially crystalline base material comprises a plurality of repeated unit cells, each repeated unit cell having at least one nanoscale pillar locally resonant oscillator extending from at least one surface of the repeated unit cell of the base material.

8. The method of claim 7 wherein each repeated cell unit comprises a plurality of nanoscale pillar locally resonant oscillators extending from a surface of the repeated unit cell, the plurality of nanoscale pillar locally resonant oscillators varying in at least one of the group comprising: height, cross-sectional area, shape, orientation, material, material composition, material distribution and surface roughness.

9. The method of claim 4 wherein a plurality of nanoscale pillar locally resonant oscillators are disposed randomly across a surface of the base material.

10. The method of claim 1 wherein the at least partially crystalline base material comprises a plurality of repeated unit cells, each repeated unit cell having at least one nanoscale locally resonant oscillator disposed within the repeated unit cell of the base material.

11. The method of claim 10 wherein each repeated cell unit comprises a plurality of nanoscale locally resonant oscillators disposed within the repeated unit cell, the plurality of nanoscale locally resonant oscillators varying in at least one of the group comprising: shape, size, orientation, surface roughness and material.

12. The method of claim 6 wherein a plurality of nanoscale locally resonant oscillators are disposed randomly within the base material.

13. The method of claim 1 wherein the at least one nanoscale locally resonant oscillator comprises an oscillator material the same as the at least partially crystalline base material.

14. The method of claim 1 wherein the at least one nanoscale locally resonant oscillator comprises at least one oscillator material different than the at least partially crystalline base material.

15. The method of claim 1 wherein multiple nanoscale locally resonant oscillators comprise at least one oscillator material within at least one locally resonant oscillator different than the at least partially crystalline base material.

16. The method of claim 1 wherein the at least partially crystalline base material comprises at least one of the group comprising: a nanoscale single dimension material, a nanoscale wire-shaped base material, a nanoscale rod-shaped base material, a nanoscale two dimensional base material, a nanoscale thin-film base material, a nanoscale membrane base material, a surface with material extending into its depth, a three dimensional base material and a bulk material.

17. The method of claim 1 wherein at least one feature size in the base material including one or more of the group comprising a thickness of a thin film, a thickness of a membrane, a cross-sectional size of a wire, a cross-sectional size of a rod, a size of the locally resonant oscillators and a spacing distance between the locally resonant oscillators is on the order of 1 nm to 500 nm.

18. The method of claim 1 wherein at least one feature size in the base material including one or more of the group comprising a thickness of a thin film, a thickness of a membrane, a cross-sectional size of a wire, a cross-sectional size of a rod, a size of the locally resonant oscillators and a spacing distance between the locally resonant oscillators is less than a mean free path in the base material.

19. The method of claim 1 wherein the type, geometrical and material features of the at least one nanoscale locally resonant oscillator and the type, geometrical and material features of the at least partially crystalline base material are selected in a manner that allows the interacting local resonances to have the following characteristics: be numerous and be well spread out across a phonon spectrum of the base material starting within a frequency range corresponding to as low as that of acoustic branches of the base material.

20. A nanophononic metamaterial structure comprising:
an at least partially crystalline base material configured to allow a plurality of phonons to move to provide thermal conduction through the base material;
at least one nanoscale locally resonant oscillator coupled to the at least partially crystalline base material,
wherein the at least one nanoscale locally resonant oscillator is configured to generate at least one vibration mode to interact with the plurality of phonons moving within the base material and slowing group velocities of at least a portion of the interacting phonons and reduce thermal conductivity through the base material.

21. The nanophononic metamaterial structure of claim 20 wherein the plurality of local vibration modes interact with an underlying lattice dispersion of the at least partially crystalline base material and the interaction of the at least one vibration mode and the plurality of phonons reduce the group velocities of the at least a portion of the interacting phonons at or near a coupling in a frequency between the vibration modes and the plurality of phonons.

22. The nanophononic metamaterial structure of claim 20 wherein the at least partially crystalline material comprises at least one of the group comprising: a semiconductor material, a silicon semiconductor material, a germanium semiconductor material, a gallium arsenide semiconductor material, a superlattice material, a nanocomposite material, a nanostructured nanocomposite material, a thermoelectric material, a nanostructured thermoelectric material, a nanostructured thermoelectric material including one or more holes or inclusions in a periodic or random spatial distribution within a body of the nanostructured thermoelectric material, a nanophononic crystal.

23. The nanophononic metamaterial structure of claim 20 wherein the at least one locally resonant oscillator comprises at least one nanoscale pillar extending from a surface of the at least partially crystalline base material.

24. The nanophononic metamaterial structure of claim 23 wherein the extension of the at least one nanoscale locally resonant oscillator from at least one surface of the base material improves the thermoelectric energy conversion figure of merit, ZT, by freeing the at least partially crystalline base material from local resonators acting as internal scatterers that hinder the motion of electrons and cause a reduction in electrical conductivity of the base material.

25. The nanophononic metamaterial structure of claim 20 wherein the at least one nanoscale locally resonant oscillator comprises at least one nanoscale oscillator disposed within the at least partially crystalline base material.

26. The nanophononic metamaterial structure of claim 20 wherein the at least partially crystalline base material comprises a plurality of repeated unit cells, each repeated unit cell having at least one nanoscale pillar locally resonant oscillator extending from at least one surface of the repeated unit cell of the nanoscale base material.

27. The nanophononic metamaterial structure of claim 26 wherein each repeated cell unit comprises a plurality of nanoscale pillar locally resonant oscillators extending from a surface of the repeated unit cell, the plurality of nanoscale pillar locally resonant oscillators varying in at least one of the group comprising: height, cross-sectional area, shape, orientation, material, material composition, material distribution and surface roughness.

28. The nanophononic metamaterial structure of claim 23 wherein the at least one locally resonant oscillator comprises a plurality of nanoscale pillar locally resonant oscillators disposed randomly across a surface of the base material.

29. The nanophononic metamaterial structure of claim 20 wherein the at least partially crystalline base material comprises a plurality of repeated unit cells, each repeated unit cell having at least one nanoscale locally resonant oscillator disposed within the repeated unit cell of the base material.

30. The nanophononic metamaterial structure of claim 29 wherein each repeated cell unit comprises a plurality of nanoscale locally resonant oscillators disposed within the repeated unit cell, the plurality of nanoscale locally resonant oscillators varying in at least one of the group comprising: shape, size, orientation, surface roughness and material.

31. The nanophononic metamaterial structure of claim 25 wherein a plurality of nanoscale locally resonant oscillators are disposed randomly within the base material.

32. The nanophononic metamaterial structure of claim 20 wherein the at least partially crystalline base material comprises at least one of the group comprising: a nanoscale single dimension material, a nanoscale wire-shaped base material, a nanoscale rod-shaped base material, a nanoscale two dimensional base material, a nanoscale thin-film base material, a nanoscale membrane base material, a surface with material extending into its depth, a three dimensional base material and a bulk material.

33. The nanophononic metamaterial structure of claim 20 wherein at least one feature size in the base material includes one or more of the group comprising a thickness of a thin film, a thickness of a membrane, a cross-sectional size of a wire, a cross-sectional size of a rod, a size of the locally resonant oscillators and a spacing distance between the locally resonant oscillators is on the order of 1 nm to 500 nm.

34. The nanophononic metamaterial structure of claim 20 wherein at least one feature size in the base material including one or more of the group comprising a thickness of a thin film, a thickness of a membrane, a cross-sectional size of a wire, a cross-sectional size of a rod, a size of the locally resonant oscillators and a spacing distance between the locally resonant oscillators is less than a mean free path in the base material.

35. The nanophononic metamaterial structure of claim 20 wherein the at least one locally resonant oscillator disposed within the at least partially crystalline base material or extending from at least one surface of the at least partially crystalline base material is fabricated via at least one of the group comprising: deposition, physical vapor deposition, chemical vapor deposition, electrochemical deposition, molecular beam epitaxy, atomic layer deposition, removal, etching, wet etching, dry etching, chemical-mechanical planarization, patterning, lithography, ion beam lithography, utilization of scaffolds, nano-architecting lattice structures and using nanolattices as a scaffold on which to pattern thermoelectric materials.

36. The nanophononic metamaterial structure of claim 20 wherein the at least one nanoscale locally resonant oscillator comprises an oscillator material the same as the at least partially crystalline base material.

37. The nanophononic metamaterial structure of claim 20 wherein the at least one nanoscale locally resonant oscillator comprises at least one oscillator material different than the at least partially crystalline base material.

38. The nanophononic metamaterial structure of claim 20 wherein multiple nanoscale locally resonant oscillators comprise at least one oscillator material within at least one resonator different than the at least partially crystalline base material.

39. The nanophononic metamaterial structure of claim 20 wherein the type, geometrical and material features of the at least one nanoscale locally resonant oscillator and the type, geometrical and material features of the at least partially crystalline base material are selected in a manner that allows the interacting local resonances to have the following characteristics: be numerous and be well spread out across a phonon spectrum of the base material starting within a range corresponding to as low as that of acoustic branches of the base material.

* * * * *